(12) United States Patent
Cameron et al.

(10) Patent No.: US 7,137,059 B2
(45) Date of Patent: Nov. 14, 2006

(54) **SINGLE STAGE IMPLEMENTATION OF MIN\*, MAX\*, MIN AND /OR MAX TO PERFORM STATE METRIC CALCULATION IN SISO DECODER**

(75) Inventors: Kelly Brian Cameron, Irvine, CA (US); Thomas A. Hughes, Jr., Dana Point, CA (US); Hau Thien Tran, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 458 days.

(21) Appl. No.: 10/335,702

(22) Filed: Jan. 2, 2003

(65) Prior Publication Data

US 2004/0098662 A1 May 20, 2004

Related U.S. Application Data

(60) Provisional application No. 60/427,979, filed on Nov. 20, 2002.

(51) Int. Cl.
*H03M 13/03* (2006.01)
(52) U.S. Cl. .................................. 714/794; 714/795
(58) Field of Classification Search ............... 714/794, 714/795
See application file for complete search history.

(56) References Cited

U.S. PATENT DOCUMENTS 5,406,570 A    4/1995  Berrou et al.
5,446,747 A    8/1995  Berrou
5,563,897 A   10/1996  Pyndiah et al.
6,065,147 A    5/2000  Pyndiah et al.
6,119,264 A    9/2000  Berrou et al.
6,122,763 A    9/2000  Pyndiah et al.
6,671,335 B1 * 12/2003 Kim et al. .................. 375/340
2002/0042901 A1 * 4/2002 Miyauchi et al. ........... 714/799

FOREIGN PATENT DOCUMENTS

EP    0 735 696 A2   10/1996
EP    0 735 696 A3    1/1999
FR    91 05278 A1    10/1992

\* cited by examiner

*Primary Examiner*—Joseph D. Torres
(74) *Attorney, Agent, or Firm*—Garlick Harrison & Markison; Shayne X. Short

(57) ABSTRACT

Single stage implementation of min\*, max\*, min and/or max to perform state metric calculation in soft-in soft-out (SISO) decoder. This allows for calculation of state metrics in an extremely efficient, fast manner. When performing min or max calculations, comparisons are made using 2 element combinations of the available inputs. Subsequently, logic circuitry employs the results of the 2 element comparisons the smallest (min) or largest (max) input. The max or min implementations may be employed as part of the max\* and/or min\* implementations. For max\* and/or min\* implementations, simultaneous calculation of appropriate values is performed while determining which input is the smallest or largest. Thereafter, the determination of which input is the smallest or largest is used to select the appropriate resultant value (of the values calculated) for max\* and/or min\*. Various degrees of precision are employed for the log correction values within the max\* and/or min\* implementations.

50 Claims, 30 Drawing Sheets single stage min\* (or max\*) design using approximation min(A,B,C,D) calculation functionality min*(A,B,C,D) calculation functionality (prior art)

High Definition Television (HDTV) communication system

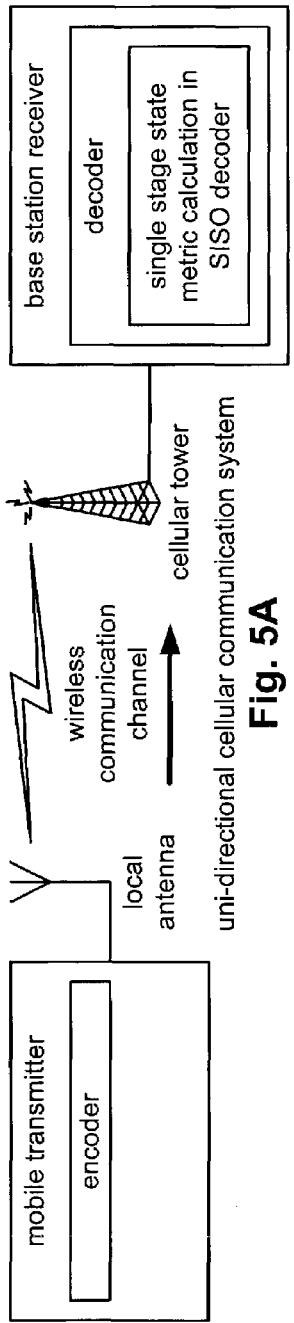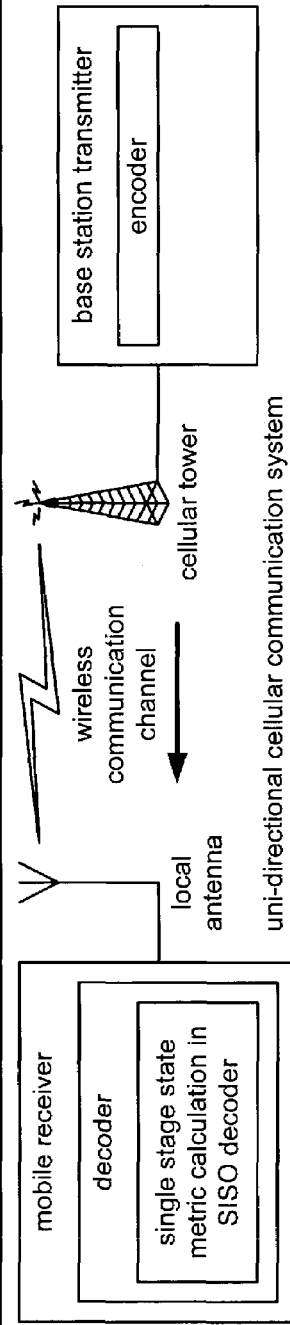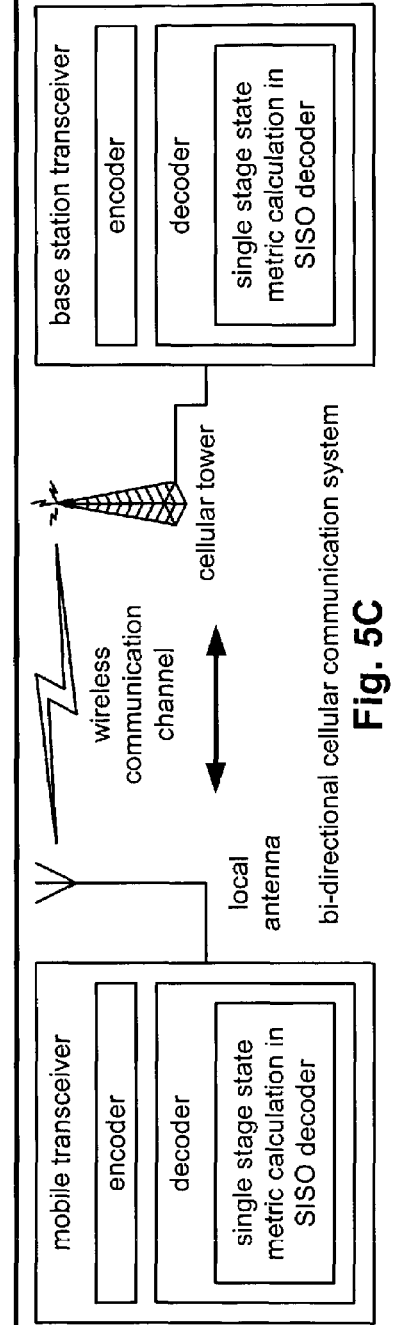

uni-directional microwave communication system bi-directional microwave communication system

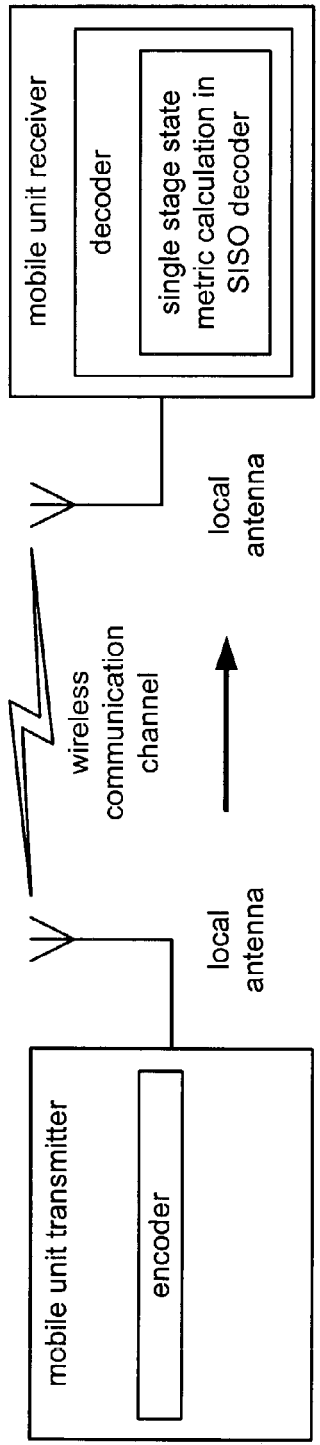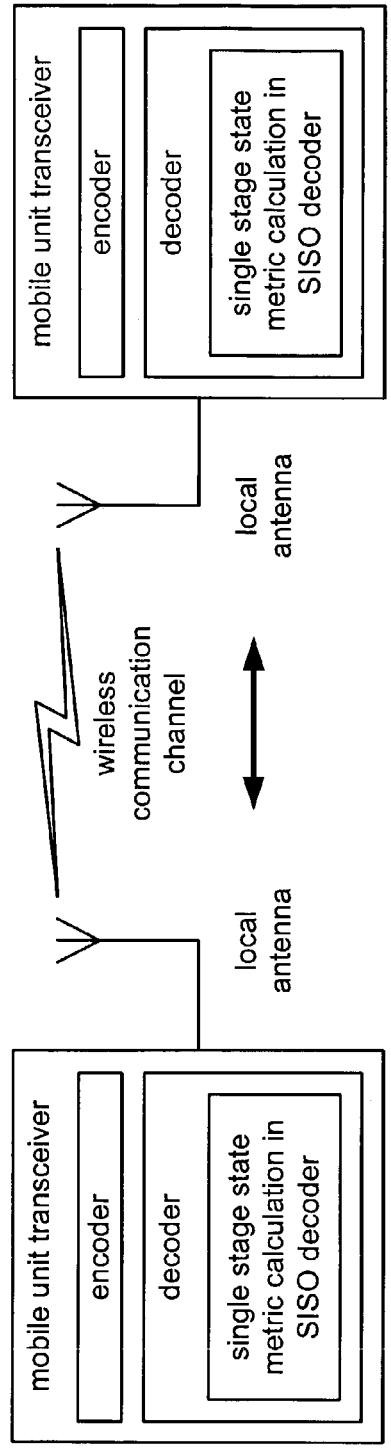

fiber-optic communication system satellite receiver set-top box system single stage min (or max) design single stage min (or max) design (4 input embodiment)

implementation of single stage min design (4 input embodiment)

alternative implementation of single stage min design (4 input embodiment)

| M_AB | M_AC | M_AD | M_BC | M_BD | M_CD | Smallest | min A or B | min A or C |
|---|---|---|---|---|---|---|---|---|
| 1 | 1 | 1 |  |  |  | A | 1 | 1 |
| 0 |  |  | 1 | 1 |  | B | 1 | 0 |
|  | 0 |  | 0 |  | 1 | C | 0 | 1 |
|  |  | 0 |  | 0 | 0 | D | 0 | 0 | logic circuitry table (4 input embodiment)

Fig. 15 single stage min* (or max*) design preliminary calculation single stage min* (or max*) design (4 input embodiment)

preliminary calculation (4 input embodiment)

implementation of min (or max) selection control (4 input embodiment)

Fig. 19 implementation of min (or max) selection (4 input embodiment)

single stage min* (or max*) design using approximation single stage min* (or max*) design using approximation (4 input embodiment)

intermediate log correction value calculation (4 input embodiment)

alternative #1 of final log correction value calculation (4 input embodiment)

alternative #2 of final log correction value calculation (4 input embodiment)

possible final log correction value calculation (4 input embodiment)

alternative #4 embodiment of final log correction value calculation (4 input embodiment)

single stage min* (or max*) processing method single stage min* (or max*) processing method using approximation

SINGLE STAGE IMPLEMENTATION OF MIN*, MAX*, MIN AND /OR MAX TO PERFORM STATE METRIC CALCULATION IN SISO DECODER

CROSS REFERENCE TO RELATED PATENTS/PATENT APPLICATIONS

The present U.S. Utility patent application claims priority pursuant to 35 U.S.C. § 119(e) to the following U.S. Provisional Patent Applications which is hereby incorporated herein by reference in its entirety and made part of the present U.S. Utility patent application for all purposes:

1. U.S. Provisional Application Ser. No. 60/427,979, "Single stage implementation of min*, max*, min and/or max to perform state metric calculation in SISO decoder," filed Nov. 20, 2002, pending.

BACKGROUND OF THE INVENTION

1. Technical Field of the Invention

The invention relates generally to communication systems; and, more particularly, it relates to decoding of encoded signals within such communication systems.

2. Description of Related Art

Data communication systems have been under continual development for many years. One such type of communication system that has been of significant interest lately is a communication system that employs turbo codes. Another type of communication system that has also received interest is a communication system that employs Low Density Parity Check (LDPC) code. A primary directive in these areas of development has been to try continually to lower the error floor within a communication system. The ideal goal has been to try to reach Shannon's limit in a communication channel. Shannon's limit may be viewed as being the data rate to be used in a communication channel, having a particular Signal to Noise Ratio (SNR), that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB from the theoretical Shannon limit. While this example was achieved using an irregular LDPC code of a length of one million, it nevertheless demonstrates the very promising application of LDPC codes within communication systems.

In performing calculations when decoding a received signal, it is common for decoders to perform determination of a largest (using a max calculation or a max operation) and/or a smallest (using a min calculation or a min operation) to determine a largest or smallest value from among a number of values. This processing is oftentimes common in performing calculations of state metrics within soft-in soft-out (SISO) decoders. For example, several state metrics are calculated, and the smallest and/or largest state metric is determined to be the proper state metric. Depending upon the decision criteria, the largest and/or smallest state metric may be determined to be the "proper" state metric.

In performing calculations when decoding a received signal, it is also common for decoders to operate in the natural log (ln) domain when performing various calculations. Many turbo code decoders fall into this category, and many LDPC decoders also fall in to this category. By operating within the natural log (ln) domain, this converts all multiplications to additions, divisions to subtractions, and eliminates exponentials entirely, without affecting Bit Error Rate (BER) performance.

As an example, one somewhat difficult calculation is the natural log (ln) domain includes calculating the sum of exponentials as shown below:

$$\ln(e^a + e^b + e^c + \ldots)$$

This calculation can be significantly reduced in complexity using the Jacobian formula shown below that operates on two input values:

$$\max{}^*(a,b) = \ln(e^a + e^b) = \max(a,b) + \ln(1 + e^{-|a-b|})$$

This calculation is oftentimes referred to as being a max* calculation or max* operation. It is noted that the Jacobian formula simplification of the equation shown above presents the max* operation of only two variables, a and b. This calculation may be repeated over and over when trying to calculate a longer sum of exponentials. For example, to calculate the following term, $\ln(e^a + e^b + e^c)$, two subsequent max* operations may be performed, one after the other:

$$\max{}^*(a,b) = \ln(e^a + e^b) = \max(a,b) + \ln(1 + e^{-|a-b|}) = x$$

$$\max{}^*(a,b,c) = \max{}^*(x,c) = \ln(e^x + e^c) = \max(x,c) + \ln(1 + e^{-|x-c|})$$

While there has a been a great deal of development within the context of turbo code and LDPC code, the extensive processing and computations required to perform decoding therein can be extremely burdensome. As shown above within this simple example, the calculating the sum of exponentials illustrates the potentially complex and burdensome calculations needed when performing decoding. Oftentimes, the processing requirements are so burdensome that they simply prohibit their implementation within systems having very tight design budgets.

There have been some non-optimal approaches to deal with the burdensome calculations required to do such burdensome calculations. For example, in performing this basic max* operation, some decoders simply exclude the logarithmic correction factor of $\ln(1 + e^{-|a-b|})$ altogether and use only the max(a,b) result which may be implemented within a single instruction within a Digital Signal Processor (DSP). Such is the case, as described above, within decoders that perform min or max calculations.

However, it is clearly seen that some degree of precision is sacrificed when calculating a sum of exponentials. This will inherently introduce some degradation in decoder performance. Most of the common approaches that seek to provide some computational improvements either cut corners in terms of computational accuracy, or they do not provide a sufficient reduction in computational complexity to justify their integration into a given decoder. The prohibiting factor concerning the implementation of many turbo codes and LDPC codes is oftentimes the inherent computational complexity required therein.

FIG. 1 is a diagram illustrating a prior art embodiment of min(A,B,C,D) calculation functionality. Within this figure, two cascaded stages of a min calculations are performed to generate an ultimate min selection from among four inputs. The calculations may be described mathematically as follows:

$$\min[A,B,C,D] = \min[\min(A,B), \min(C,D)]$$

Here, we have two stages of min operations. Each min operation is implemented using a compare and select operation that employs a multiplexor (MUX) that receives 2 inputs and whose selection is based on a sign bit that corresponds to the difference between those two inputs. For example, looking at the top functional block within this prior art figure, the inputs A and B are provided to the MUX. In parallel, the B input value is subtracted from the A input value to generate a sign bit that is used to select either the A or the B, to be a output from this MUX. This selected output will then be the result in value of min(A,B). Similarly, a comparable operation may then be performed for the C and D inputs. This selected output would then be the result in value of min(C,D). A third min operation will be performed on the intermediate results from the min(A,B) operation and the min(C,D) operation to generate the ultimate output that will be the smallest input value selected from among the four input values.

Within this embodiment, each min operation involves a subtractor/adder and a MUX. However, there are two subsequent processing stages that must be performed for this simple 4 input min selection operation. Therefore the longest delay processing, when considering the two subsequent processing stages, would be in the sequential operations performed by a first subtractor and a first MUX (of the first stage), and then followed by a second subtractor and also a second MUX (of the second stage). It again noted that this illustrated embodiment operates on only 4 inputs. If the number of inputs were to increase, then the total delay processing would increase geometrically. Clearly, the implementation of this prior art min selection embodiment prohibits its implementation within designs that have a very tight delay processing budgets. Particularly when dealing with higher order decoders, such a straightforward implementation may not be employed. Even more particularly within decoders whose operational speed is of paramount importance, the long delay processing of such a prior art implementation would simply be prohibitive, in that, the speed at which the decoder decodes received information simply could not meet the operational and design specifications of the communication system.

FIG. 2 is a diagram illustrating a prior art embodiment of min*(A,B,C,D) calculation functionality. The min* calculation is analogous to the max* calculation as shown below:

$$\max{}^{*}(a,b) = \ln(e^{a} + e^{b}) = \max(a,b) + \ln(1 + e^{-|a-b|})$$

$$\min{}^{*}(a,b) = -\ln(e^{-a} + e^{-b}) = \min(a,b) - \ln(1 + e^{-|a-b|})$$

The operation of this prior art embodiment of min*(A,B,C,D) calculation functionality is quite analogous to the embodiment described above with respect to FIG. 1. For example, two cascaded min* operations are performed to generate the ultimate min* output that includes all 4 inputs. Within this figure, two stages of min* calculations are performed to generate an ultimate min* result from the four inputs. The calculations may be described mathematically as follows:

$$\min{}^{*}[A,B,C,D] = \min{}^{*}[\min{}^{*}(A,B), \min{}^{*}(C,D)]$$

For example, looking at the top functional block within this prior art figure, the inputs A and B are provided to a min* functional block. Initially, a straightforward min selection operation is performed to generate the output of min(A,B). In parallel, a log correction value that corresponds to the inputs A and B (shown as log_AB), is calculated that will then be added to the output of min(A,B). Therefore, the min*(A,B) may then be represented as min(A,B)+log_AB.

Similarly, a comparable operation may be performed for the C and D inputs. The inputs C and D are provided to a min* functional block. Initially, a straightforward min selection operation is performed to generate the output of min* (C,D). In parallel, a log correction value that corresponds to the inputs C and D (shown as log_CD), is calculated that will then be added to the output of min(C,D). Therefore, the min*(C,D) may then be represented as min(C,D)+log_CD. A third min* operation will be performed on the intermediate results from the min*(A,B) operation and the min*(C, D) operation to generate the ultimate output that will be the smallest, log corrected, input value selected from among the four input values.

Within this embodiment, each min* operation involves all of the operations of a min operation (a subtractor/adder and a MUX), as well as the log correction value calculation and the adder to combine the min result and the log correction value. However, as with the min operation described above, there are two subsequent processing stages that must be performed for this simple 4 input min* operation. Therefore the longest delay processing, when considering the two subsequent processing stages, would be in the sequential operations performed by two subsequent min* functional blocks.

All of the undesirable effects provided by the subsequent stage processing of the min selection operation described above are also applicable for this embodiment as well. For example, if the number of inputs were to increase, then the total delay processing would increase geometrically. Clearly, the implementation of this prior art min* embodiment prohibits its implementation within designs that have very tight delay processing budgets. Particularly when dealing with higher order decoders, such a straightforward implementation may not be employed. Even more particularly within decoders whose operational speed is of paramount importance, the long delay processing of such a prior art implementation would simply be prohibitive, in that, the speed at which the decoder decodes received information simply could not meet the operational and design specifications of the communication system.

As can clearly be seen by the prior art examples described above, there still exists a need in the art to provide for more efficient solutions when making calculations, such as max*, min*, max and/or min, within communication decoders.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 5A and FIG. 5B are system diagrams illustrating embodiment of uni-directional cellular communication systems that are built according to the invention.

FIG. 5C is a system diagram illustrating embodiment of a bi-directional cellular communication system that is built according to the invention.

FIG. 7A is a system diagram illustrating embodiment of a uni-directional point-to-point radio communication system that is built according to the invention.

FIG. 7B is a system diagram illustrating embodiment of a bi-directional point-to-point radio communication system that is built according to the invention.

FIG. 15 is a table diagram illustrating a logic circuitry table that may be employed for the 4 input embodiment of the single stage min (or max) design of the FIG. 12.

DETAILED DESCRIPTION OF THE INVENTION

Various aspects of the invention may be found in a single stage implementation of min*, max*, min and/or max that is operable to perform state metric calculation in a soft-in soft-out (SISO) decoder. This allows for calculation of state metrics in an extremely efficient, fast manner. When performing min or max calculations, comparisons are made using 2 element combinations of the available inputs. Subsequently, logic circuitry employs the results of the 2 element comparisons the smallest (min) or largest (max) input. The max or min implementations may be employed as part of the max* and/or min* implementations. For max* and/or min* implementations, simultaneous calculation of appropriate values is performed while determining which input is the smallest or largest. Thereafter, the determination of which input is the smallest or largest is used to select the appropriate resultant value (of the values calculated) for max* and/or min*. Various degrees of precision are employed for the log correction values within the max* and/or min* implementations.

Figure 3:
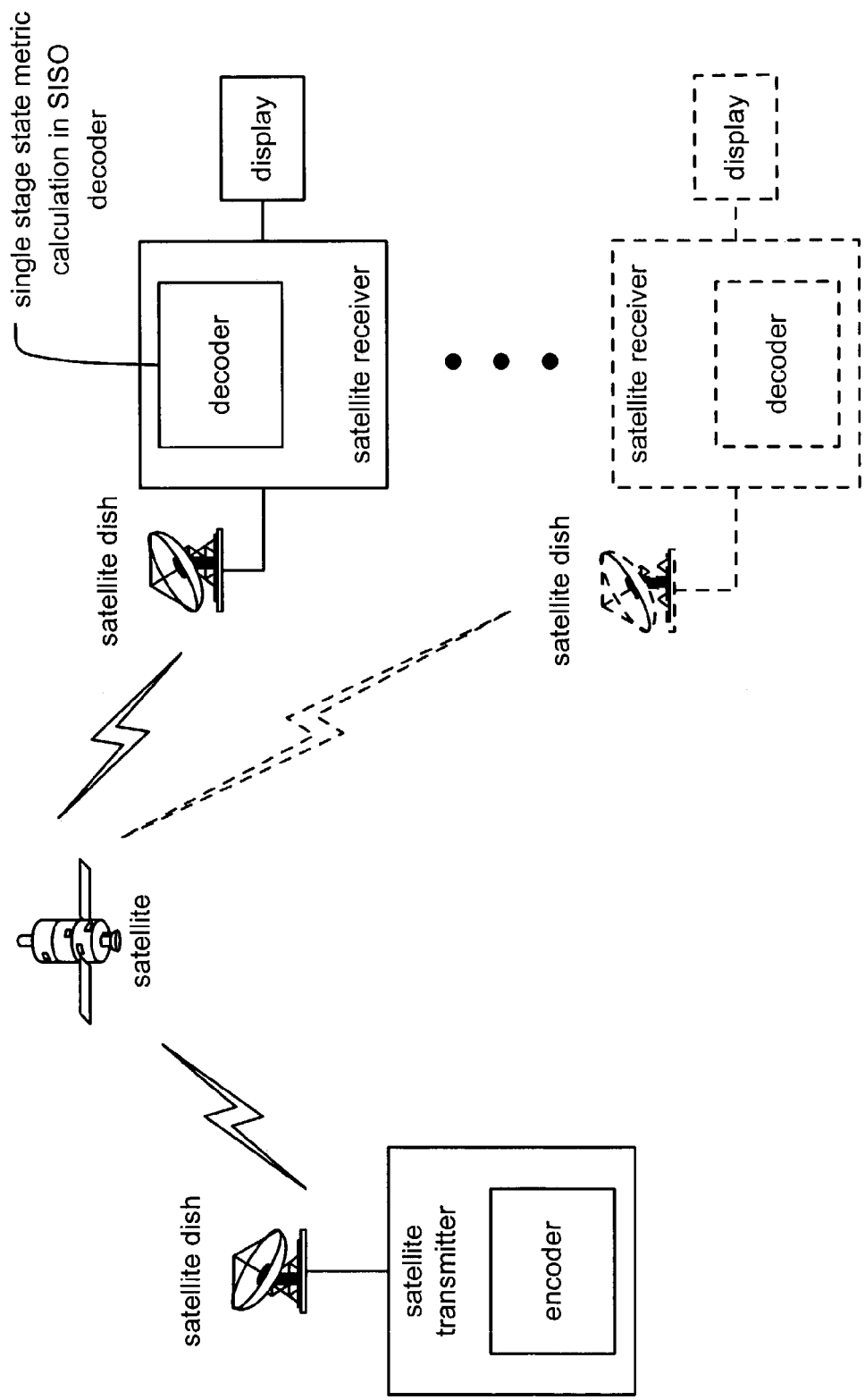
FIG. 3 is a system diagram illustrating an embodiment of a satellite communication system that is built according to the invention.

FIG. 3 is a system diagram illustrating an embodiment of a satellite communication system that is built according to the invention. A satellite transmitter is communicatively coupled to a satellite dish that is operable to communicate with a satellite. The satellite transmitter may also be communicatively coupled to a wired network. This wired network may include any number of networks including the Internet, proprietary networks, and/or other wired networks. The satellite transmitter employs the satellite dish to communicate to the satellite via a wireless communication channel. The satellite is able to communicate with one or more satellite receivers (each having a satellite dish). Each of the satellite receivers may also be communicatively coupled to a display.

Here, the communication to and from the satellite may cooperatively be viewed as being a wireless communication channel, or each of the communication to and from the satellite may be viewed as being two distinct wireless communication channels.

For example, the wireless communication "channel" may be viewed as not including multiple wireless hops in one embodiment. In other multi-hop embodiments, the satellite receives a signal received from the satellite transmitter (via its satellite dish), amplifies it, and relays it to satellite receiver (via its satellite dish); the satellite receiver may also be implemented using terrestrial receivers such as satellite receivers, satellite based telephones, and/or satellite based Internet receivers, among other receiver types. In the case where the satellite receives a signal received from the satellite transmitter (via its satellite dish), amplifies it, and relays it, the satellite may be viewed as being a "transponder;" this is a multi-hop embodiment. In addition, other satellites may exist that perform both receiver and transmitter operations in cooperation with the satellite. In this case, each leg of an up-down transmission via the wireless communication channel would be considered separately.

In whichever embodiment, the satellite communicates with the satellite receiver. The satellite receiver may be viewed as being a mobile unit in certain embodiments (employing a local antenna); alternatively, the satellite receiver may be viewed as being a satellite earth station that may be communicatively coupled to a wired network in a similar manner in which the satellite transmitter may also be communicatively coupled to a wired network.

The satellite transmitter is operable to encode information (using an encoder) that is to be transmitted to the satellite receiver; the satellite receiver is operable to decode the transmitted signal (using a decoder). The decoder that may be implemented within the satellite receivers may be implemented to include single stage state metric calculations when performing SISO decoding operations. The FIG. 3 shows just one of the many embodiments where single stage state metric calculations may be performed when performing SISO decoding operations.

Figure 4:
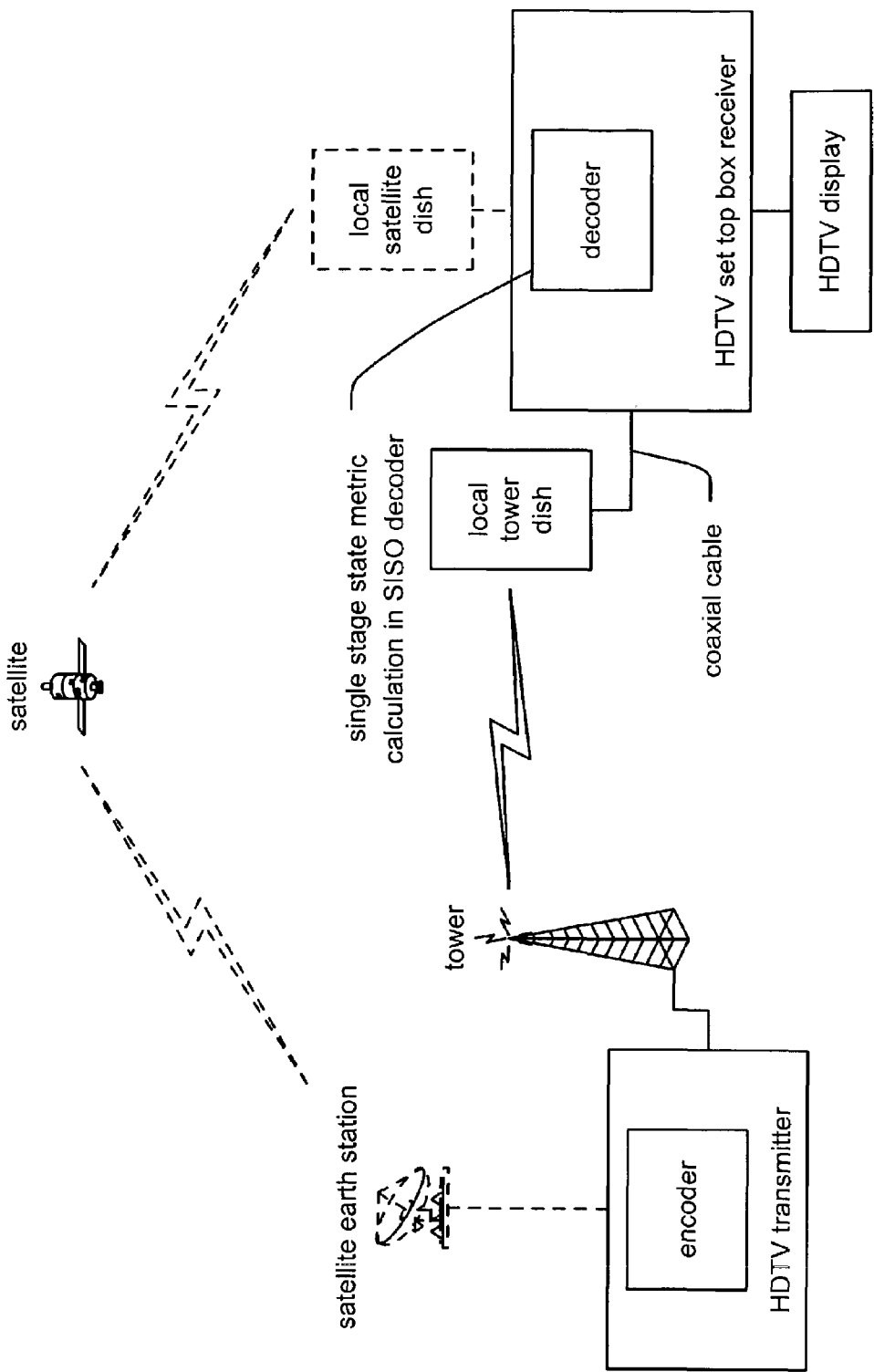
FIG. 4 is a system diagram illustrating an embodiment of a High Definition Television (HDTV) communication system that is built according to the invention.

FIG. 4 is a system diagram illustrating an embodiment of a High Definition Television (HDTV) communication system that is built according to the invention. An HDTV transmitter is communicatively coupled to a tower. The HDTV transmitter, using its tower, transmits a signal to a local tower dish via a wireless communication channel. The local tower dish communicatively couples to an HDTV set top box receiver via a coaxial cable. The HDTV set top box receiver includes the functionality to receive the wireless transmitted signal that has been received by the local tower dish; this may include any transformation and/or down-converting that may be needed to accommodate any up-converting that may have been performed before and during transmission of the signal from the HDTV transmitter and its tower.

The HDTV set top box receiver is also communicatively coupled to an HDTV display that is able to display the demodulated and decoded wireless transmitted signals received by the HDTV set top box receiver and its local tower dish. The HDTV transmitter (via its tower) transmits a signal directly to the local tower dish via the wireless communication channel in this embodiment. In alternative embodiments, the HDTV transmitter may first receive a signal from a satellite, using a satellite earth station that is communicatively coupled to the HDTV transmitter, and then transmit this received signal to the local tower dish via the wireless communication channel. In this situation, the HDTV transmitter operates as a relaying element to transfer a signal originally provided by the satellite that is destined for the HDTV set top box receiver. For example, another satellite earth station may first transmit a signal to the satellite from another location, and the satellite may relay this signal to the satellite earth station that is communicatively coupled to the HDTV transmitter. The HDTV transmitter performs receiver functionality and then transmits its received signal to the local tower dish.

In even other embodiments, the HDTV transmitter employs its satellite earth station to communicate to the satellite via a wireless communication channel. The satellite is able to communicate with a local satellite dish; the local satellite dish communicatively couples to the HDTV set top box receiver via a coaxial cable. This path of transmission shows yet another communication path where the HDTV set top box receiver may communicate with the HDTV transmitter.

In whichever embodiment and whichever signal path the HDTV transmitter employs to communicate with the HDTV set top box receiver, the HDTV set top box receiver is operable to receive communication transmissions from the HDTV transmitter.

The HDTV transmitter is operable to encode information (using an encoder) that is to be transmitted to the HDTV set top box receiver; the HDTV set top box receiver is operable to decode the transmitted signal (using a decoder). The decoder that may be implemented within the HDTV set top box receiver to perform single stage state metric calculations when performing SISO decoding operations. The FIG. 4 shows yet another of the many embodiments where single stage state metric calculations may be performed when performing SISO decoding operations according to the invention.

FIG. 5A and FIG. 5B are system diagrams illustrating embodiments of uni-directional cellular communication systems that are built according to the invention.

Referring to the FIG. 5A, a mobile transmitter includes a local antenna communicatively coupled thereto. The mobile transmitter may be any number of types of transmitters including a one way cellular telephone, a wireless pager unit, a mobile computer having transmit functionality, or any other type of mobile transmitter. The mobile transmitter transmits a signal, using its local antenna, to a cellular tower via a wireless communication channel. The cellular tower is communicatively coupled to a base station receiver; the receiving tower is operable to receive data transmission from the local antenna of the mobile transmitter that has been communicated via the wireless communication channel. The cellular tower communicatively couples the received signal to the base station receiver.

The mobile transmitter is operable to encode information (using an encoder) that is to be transmitted to the base station receiver; the base station receiver is operable to decode the transmitted signal (using a decoder). The decoder may be implemented within the base station receiver to perform single stage state metric calculations when performing SISO decoding operations. The FIG. 5A shows yet another of the many embodiments where single stage state metric calculations may be performed when performing SISO decoding operations according to the invention. The FIG. 5A shows a uni-directional cellular communication system where the communication goes from the mobile transmitter to the base station receiver via the wireless communication channel.

Referring to the FIG. 5B, a base station transmitter includes a cellular tower communicatively coupled thereto. The base station transmitter, using its cellular tower, transmits a signal to a mobile receiver via a communication channel. The mobile receiver may be any number of types of receivers including a one-way cellular telephone, a wireless pager unit, a mobile computer having receiver functionality, or any other type of mobile receiver. The mobile receiver is communicatively coupled to a local antenna; the local antenna is operable to receive data transmission from the cellular tower of the base station transmitter that has been communicated via the wireless communication channel. The local antenna communicatively couples the received signal to the mobile receiver.

The base station transmitter is operable to encode information (using an encoder) that is to be transmitted to the mobile receiver; the mobile receiver is operable to decode the transmitted signal (using a decoder). The decoder may be implemented within the mobile receiver to perform single stage state metric calculations when performing SISO decoding operations. The FIG. 5B shows yet another of the many embodiments where single stage state metric calculations may be performed when performing SISO decoding operations according to the invention. The FIG. 5B shows a uni-directional cellular communication system where the communication goes from the base station transmitter to the mobile receiver via the wireless communication channel.

The FIG. 5C shows a bi-directional cellular communication system where the communication can go to and from the base station transceiver and to and from the mobile transceiver via the wireless communication channel.

Referring to the FIG. 5C, a base station transceiver includes a cellular tower communicatively coupled thereto. The base station transceiver, using its cellular tower, transmits a signal to a mobile transceiver via a communication channel. The reverse communication operation may also be performed. The mobile transceiver is able to transmit a signal to the base station transceiver as well. The mobile transceiver may be any number of types of transceiver including a cellular telephone, a wireless pager unit, a mobile computer having transceiver functionality, or any other type of mobile transceiver. The mobile transceiver is communicatively coupled to a local antenna; the local antenna is operable to receive data transmission from the cellular tower of the base station transceiver that has been communicated via the wireless communication channel. The local antenna communicatively couples the received signal to the mobile transceiver.

The base station transceiver is operable to encode information (using an encoder) that is to be transmitted to the mobile transceiver; the mobile transceiver is operable to decode the transmitted signal (using a decoder). The decoder that may be implemented within either one of the mobile transceiver and the base station transceiver may perform single stage state metric calculations when performing SISO decoding operations. Similarly, the mobile transceiver is operable to encode information (using an encoder) that is to be transmitted to the base station transceiver; the base station transceiver is operable to decode the transmitted signal (using a decoder). The decoder that may be implemented within either one of the mobile transceiver and the base station transceiver may perform single stage state metric calculations when performing SISO decoding operations.

The FIG. 5A, the FIG. 5B, and the FIG. 5C show yet more embodiments where single stage state metric calculations may be performed when performing SISO decoding operations.

Figure 6A:
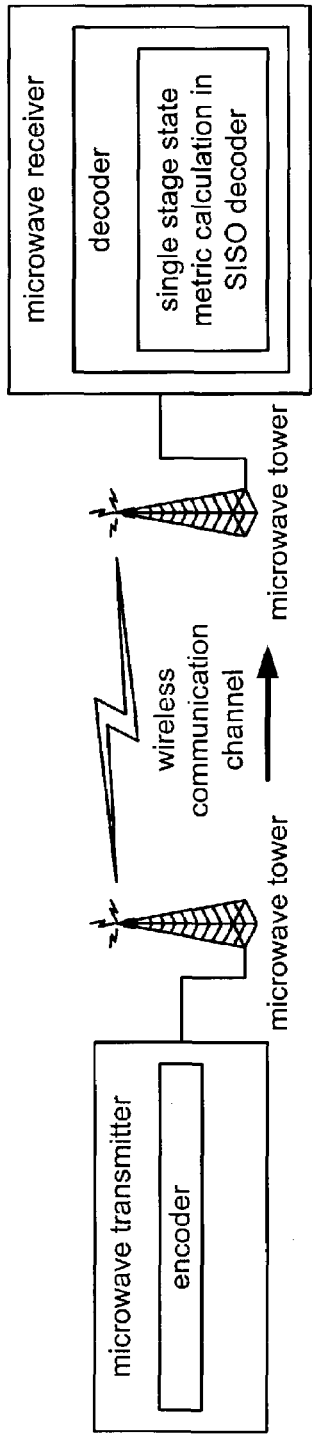
FIG. 6A is a system diagram illustrating embodiment of a uni-directional microwave communication system that is built according to the invention.

FIG. 6A is a system diagram illustrating embodiment of a uni-directional microwave communication system that is built according to the invention. A microwave transmitter is communicatively coupled to a microwave tower. The microwave transmitter, using its microwave tower, transmits a signal to a microwave tower via a wireless communication channel. A microwave receiver is communicatively coupled to the microwave tower. The microwave tower is able to receive transmissions from the microwave tower that have been communicated via the wireless communication channel.

The microwave transmitter is operable to encode information (using an encoder) that is to be transmitted to the microwave receiver; the microwave receiver is operable to decode the transmitted signal (using a decoder). The decoder may be implemented within the microwave receiver to perform single stage state metric calculations when performing SISO decoding operations. The FIG. 6A shows yet another of the many embodiments where single stage state metric calculations may be performed when performing SISO decoding operations according to the invention. The FIG. 6A shows a uni-directional microwave communication system where the communication goes from the microwave transmitter to the microwave receiver via the wireless communication channel.

The FIG. 6A shows yet another of the many embodiments where single stage state metric calculations may be performed when performing SISO decoding operations according to the invention.

Figure 6B:
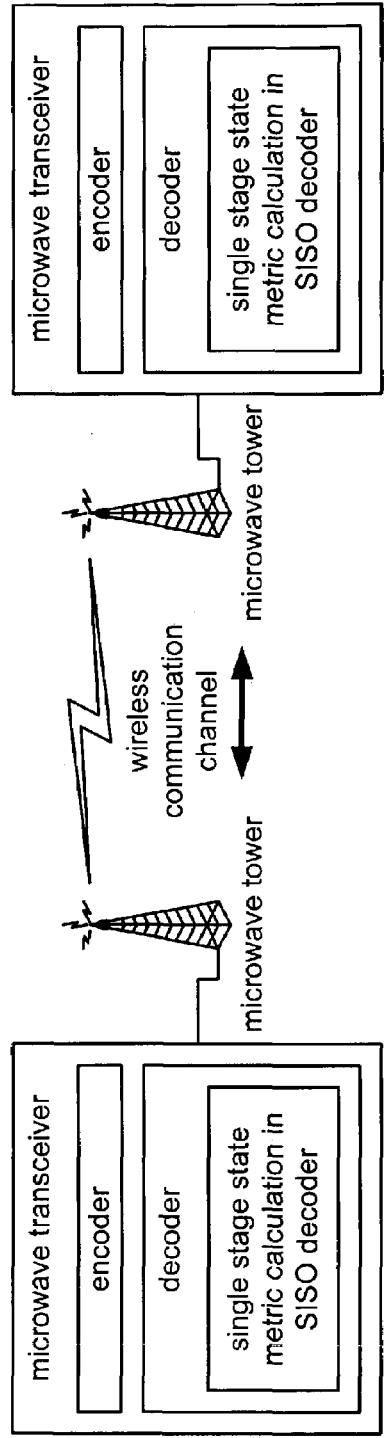
FIG. 6B is a system diagram illustrating embodiment of a bi-directional microwave communication system that is built according to the invention.

FIG. 6B is a system diagram illustrating embodiment of a bi-directional microwave communication system that is built according to the invention. Within the FIG. 6B, a first microwave transceiver is communicatively coupled to a first microwave tower. The first microwave transceiver, using the first microwave tower (the first microwave transceiver's microwave tower), transmits a signal to a second microwave tower of a second microwave transceiver via a wireless communication channel. The second microwave transceiver is communicatively coupled to the second microwave tower (the second microwave transceiver's microwave tower). The second microwave tower is able to receive transmissions from the first microwave tower that have been communicated via the wireless communication channel. The reverse communication operation may also be performed using the first and second microwave transceivers.

Each of the microwave transceivers is operable to encode information (using an encoder) that is to be transmitted to the other microwave transceiver; each microwave transceiver is operable to decode the transmitted signal (using a decoder) that it receives. Each of the microwave transceivers includes an encoder and a decoder. The decoder of either of the transceivers that may be implemented within the microwave transceivers may perform single stage state metric calculations when performing SISO decoding operations.

The FIG. 6A and the FIG. 6B show yet more embodiments where single stage state metric calculations may be performed when performing SISO decoding operations.

FIG. 7A is a system diagram illustrating embodiment of a uni-directional point-to-point radio communication system that is built according to the invention. A mobile unit transmitter includes a local antenna communicatively coupled thereto. The mobile unit transmitter, using its local antenna, transmits a signal to a local antenna of a mobile unit receiver via a wireless communication channel.

The mobile unit transmitter is operable to encode information (using an encoder) that is to be transmitted to the mobile unit receiver; the mobile unit receiver is operable to decode the transmitted signal (using a decoder). The decoder may be implemented within the mobile unit receiver to perform single stage state metric calculations when performing SISO decoding operations. The FIG. 7A shows yet another of the many embodiments where single stage state metric calculations may be performed when performing SISO decoding operations according to the invention. The FIG. 7A shows a uni-directional communication system where the communication goes from the mobile unit transmitter to the mobile unit receiver via the wireless communication channel.

FIG. 7B is a system diagram illustrating embodiment of a bi-directional point-to-point radio communication system that is built according to the invention. Within the FIG. 7B, a first mobile unit transceiver is communicatively coupled to a first local antenna. The first mobile unit transceiver, using the first local antenna (the first mobile unit transceiver's local antenna), transmits a signal to a second local antenna of a second mobile unit transceiver via a wireless communication channel. The second mobile unit transceiver is communicatively coupled to the second local antenna (the second mobile unit transceiver's local antenna). The second local antenna is able to receive transmissions from the first local antenna that have been communicated via the communication channel. The reverse communication operation may also be performed using the first and second mobile unit transceivers.

Each mobile unit transceiver is operable to encode information (using an encoder) that is to be transmitted to the other mobile unit transceiver; each mobile unit transceiver is operable to decode the transmitted signal (using a decoder) that it receives. The decoder of either of the mobile unit transceivers may perform single stage state metric calculations when performing SISO decoding operations.

The FIG. 7A and the FIG. 7B show yet more embodiments where single stage state metric calculations may be performed when performing SISO decoding operations.

Figure 8A:
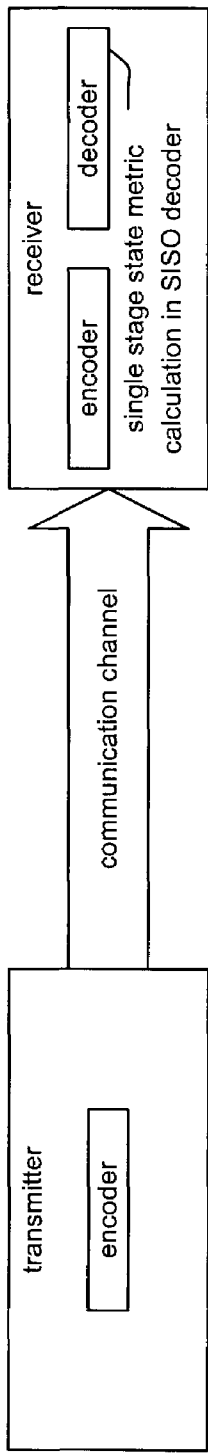
FIG. 8A is a system diagram illustrating embodiment of a uni-directional communication system that is built according to the invention.

FIG. 8A is a system diagram illustrating embodiment of a uni-directional communication system that is built according to the invention. A transmitter communicates to a receiver via a uni-directional communication channel. The uni-directional communication channel may be a wireline (or wired) communication channel or a wireless communication channel without departing from the scope and spirit of the invention. The wired media by which the uni-directional communication channel may be implemented are varied, including coaxial cable, fiber-optic cabling, and copper cabling, among other types of "wiring." Similarly, the wireless manners in which the uni-directional communication channel may be implemented are varied, including satellite communication, cellular communication, microwave communication, and radio communication, among other types of wireless communication.

The transmitter is operable to encode information (using an encoder) that is to be transmitted to the receiver; the receiver is operable to decode the transmitted signal (using a decoder). The decoder may be implemented within the receiver to perform single stage state metric calculations when performing SISO decoding operations. The FIG. 8A shows yet another of the many embodiments where single stage state metric calculations may be performed when performing SISO decoding operations according to the invention. The FIG. 8A shows a uni-directional communication system where the communication goes from the transmitter to the receiver via the communication channel.

Figure 8B:
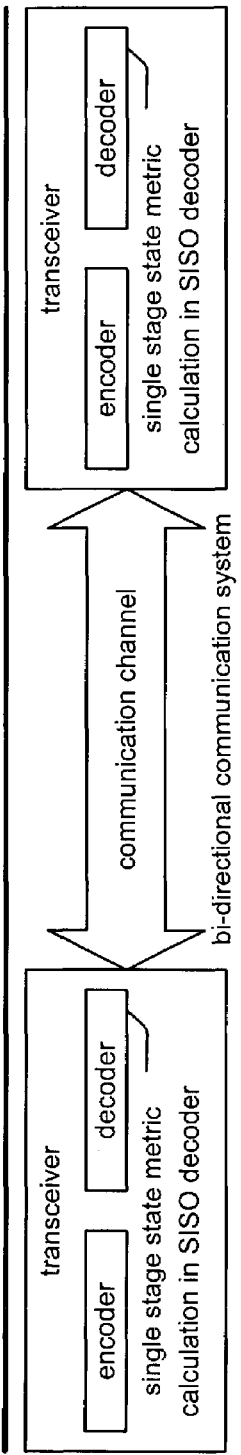
FIG. 8B is a system diagram illustrating embodiment of a bi-directional communication system that is built according to the invention.

FIG. 8B is a system diagram illustrating an embodiment of a bi-directional communication system that is built according to the invention. Within the FIG. 8B, a first transceiver is communicatively coupled to a second transceiver via a bi-directional communication channel. The bi-directional communication channel may be a wireline (or wired) communication channel or a wireless communication channel without departing from the scope and spirit of the invention. The wired media by which the bi-directional communication channel may be implemented are varied, including coaxial cable, fiber-optic cabling, and copper cabling, among other types of "wiring." Similarly, the wireless manners in which the bi-directional communication channel may be implemented are varied, including satellite communication, cellular communication, microwave communication, and radio communication, among other types of wireless communication.

Each of the transceivers is operable to encode information (using an encoder) that is to be transmitted to the other transceiver; each transceiver is operable to decode the transmitted signal (using a decoder) that it receives. The decoder of either of the transceivers may perform single stage state metric calculations when performing SISO decoding operations. The FIG. 8B shows yet another of the many embodiments where single stage state metric calculations may be performed when performing SISO decoding operations according to the invention.

Figure 8C:
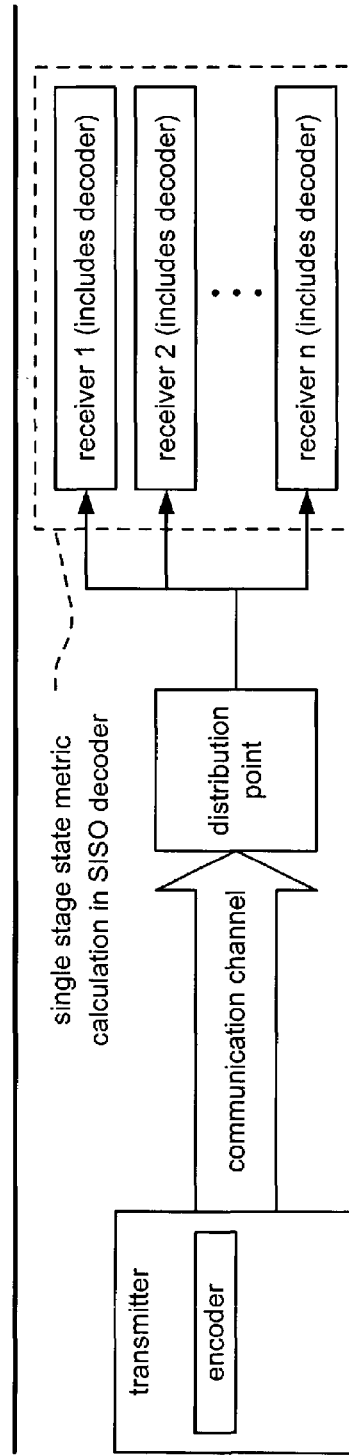
FIG. 8C is a system diagram illustrating embodiment of a one to many communication system that is built according to the invention.

FIG. 8C is a system diagram illustrating embodiment of a one to many communication system that is built according to the invention. A transmitter is able to communicate, via broadcast in certain embodiments, with a number of receivers, shown as receivers 1, 2, . . . , n via a uni-directional communication channel. The uni-directional communication channel may be a wireline (or wired) communication channel or a wireless communication channel without departing from the scope and spirit of the invention. The wired media by which the bi-directional communication channel may be implemented are varied, including coaxial cable, fiber-optic cabling, and copper cabling, among other types of "wiring." Similarly, the wireless manners in which the bi-directional communication channel may be implemented are varied, including satellite communication, cellular communication, microwave communication, and radio communication, among other types of wireless communication.

A distribution point is employed within the one to many communication system to provide the appropriate communication to the receivers 1, 2, . . . , and n. In certain embodiments, the receivers 1, 2, . . . , and n each receive the same communication and individually discern which portion of the total communication is intended for themselves.

The transmitter is operable to encode information (using an encoder) that is to be transmitted to the receivers 1, 2, . . . , and n; each of the receivers 1, 2, . . . , and n is operable to decode the transmitted signal (using a decoder). The decoder that may be implemented within each of the receivers 1, 2, . . . , and n to perform single stage state metric calculations when performing SISO decoding operations. The FIG. 8C shows yet another of the many embodiments where single stage state metric calculations may be performed when performing SISO decoding operations according to the invention.

Figure 9:
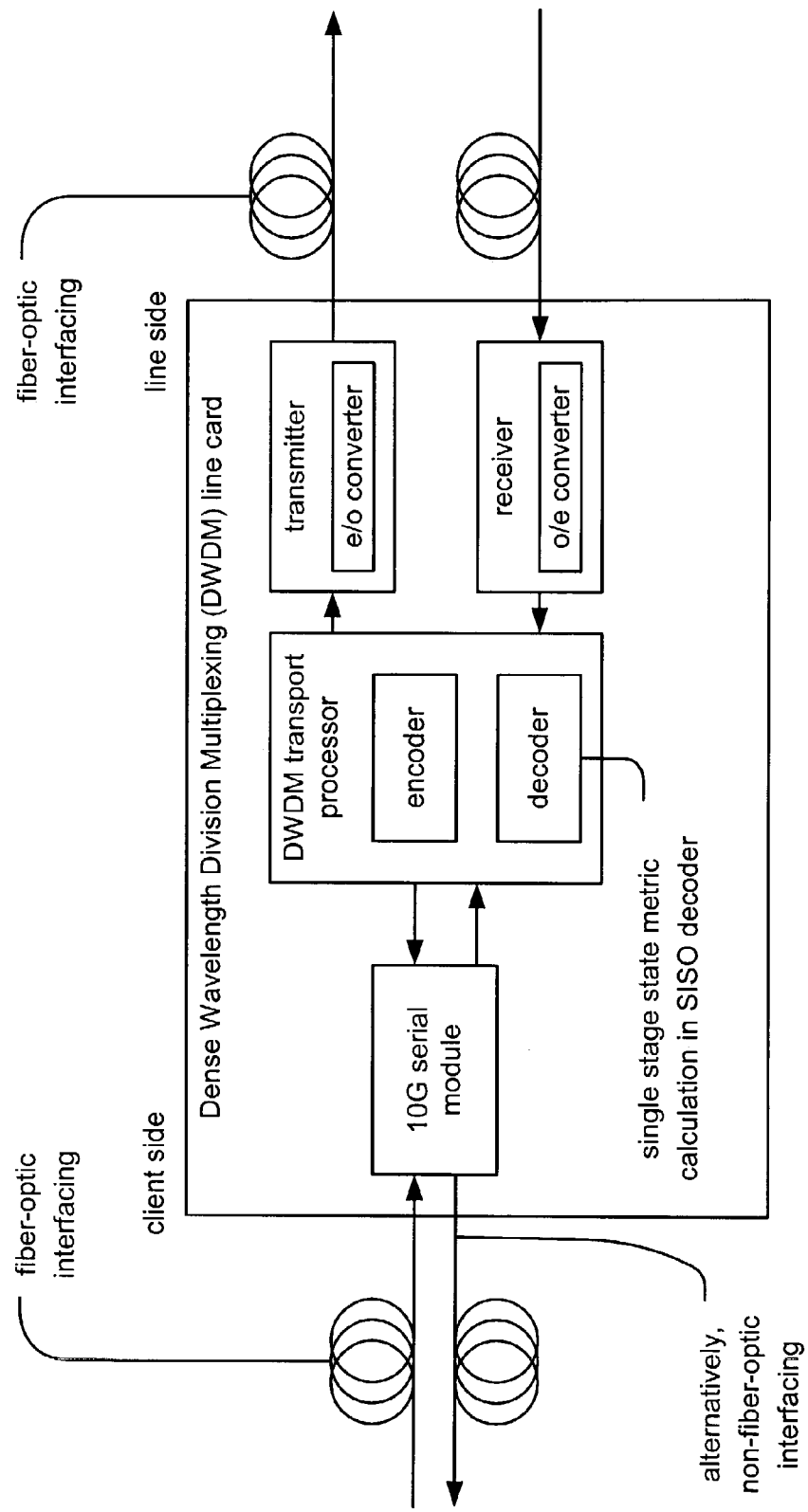
FIG. 9 is a system diagram illustrating an embodiment of a fiber-optic communication system that is built according to the invention.

FIG. 9 is a system diagram illustrating an embodiment of a fiber-optic communication system that is built according to the invention. The fiber-optic communication system is operable to support a single stage implementation of min*, max*, min and/or max to perform state metric calculation in soft-in soft-out (SISO) decoding operations. The fiber-optic communication system includes a Dense Wavelength Division Multiplexing (DWDM) line card that is interposed between a line side and a client side.

DWDM is a technology that has gained increasing interest recently. From both technical and economic perspectives, the ability to provide potentially unlimited transmission capacity is the most obvious advantage of DWDM technology. The current investment already made within fiber-optic infrastructure can not only be preserved when using DWDM, but it may even be optimized by a factor of at least 32. As demands change, more capacity can be added, either by simple equipment upgrades or by increasing the number of wavelengths (lambdas) on the fiber-optic cabling itself, without expensive upgrades. Capacity can be obtained for the cost of the equipment, and existing fiber plant investment is retained. From the bandwidth perspective, some of the most compelling technical advantage of DWDM can be summarized as follows:

The transparency of DWDM: Because DWDM is a physical layer architecture (PHY), it can transparently support both Time Division Multiplexing (TDM) and data formats such as asynchronous transfer mode (ATM), Gigabit Ethernet, ESCON, and Fibre Channel with open interfaces over a common physical layer.

The scalability of DWDM: DWDM can leverage the abundance of dark fiber in many metropolitan area and enterprise networks to quickly meet demand for capacity on point-to-point links and on spans of existing SONET/SDH rings.

The dynamic provisioning capabilities of DWDM: the fast, simple, and dynamic provisioning of network connections give providers the ability to provide high-bandwidth services in days rather than months.

Fiber-optic interfacing is employed at each of the client and line sides of the DWDM line card. The DWDM line card includes a transport processor that includes functionality to support DWDM long haul transport, DWDM metro transport, next-generation SONET/SDH multiplexers, digital cross-connects, and fiber-optic terminators and test equipment. On the line side, the DWDM line card includes a transmitter, that is operable to perform electrical to optical conversion for interfacing to an optical medium, and a receiver, that is operable to perform optical to electrical conversion for interfacing from the optical medium. On the client side, the DWDM line card includes a 10 G serial module. That is operable to communicate with any other devices on the client side of the fiber-optic communication system using a fiber-optic interface. Alternatively, the interface may be implemented using non-fiber-optic media, including copper cabling and/or some other type of interface medium.

The DWDM transport processor of the DWDM line card includes a decoder that is used to decode received signals from either one or both of the line and client sides and an encoder that is used to encode signals to be transmitted to either one or both of the line and client sides. The decoder may be implemented within the receiver to perform single stage state metric calculations when performing SISO decoding operations. The FIG. 9 shows yet another of the many embodiments where a device may employ a single stage implementation of min*, max*, min and/or max to perform state metric calculation in soft-in soft-out (SISO) decoding operations according to any one or more of the various embodiments of the invention.

Figure 10:
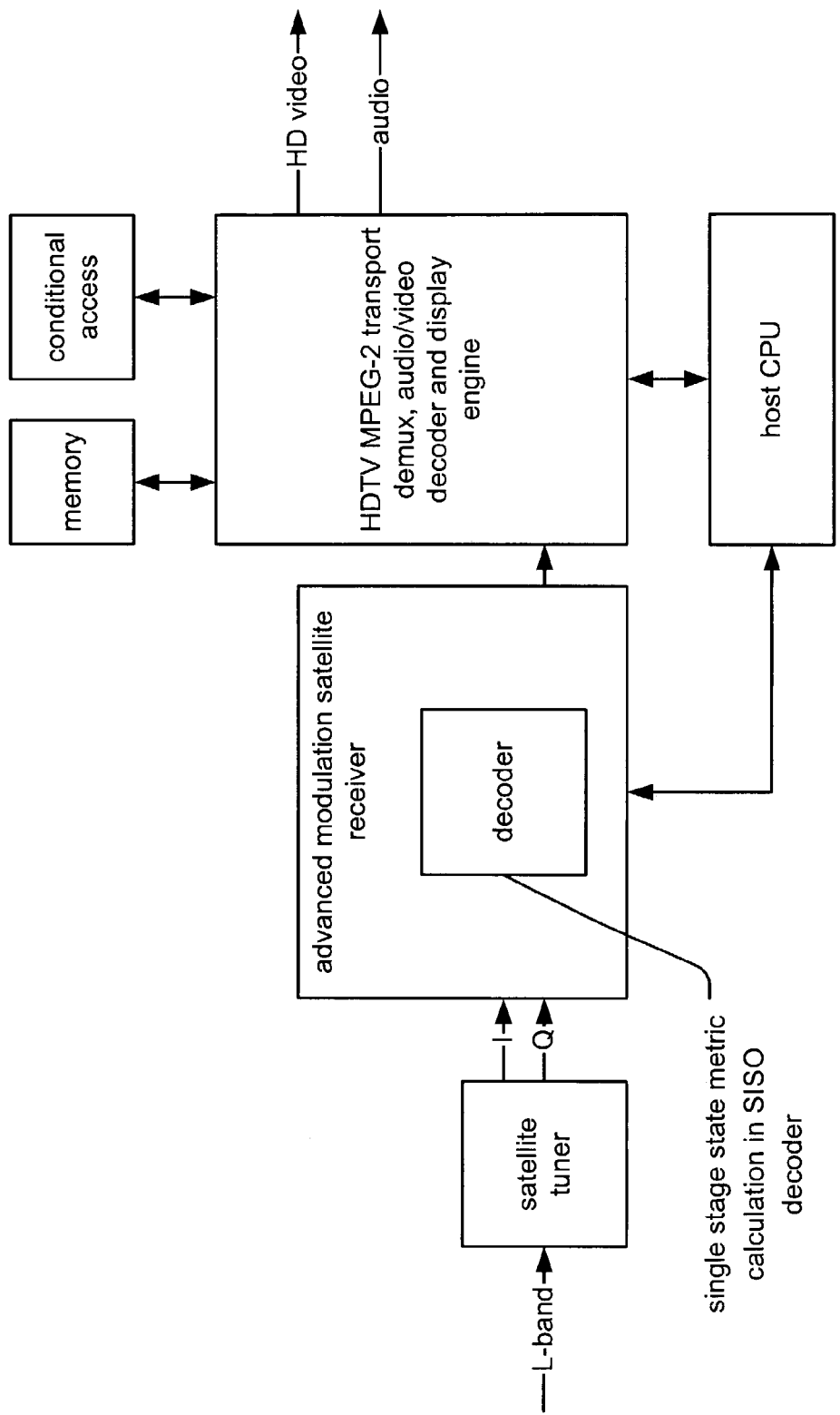
FIG. 10 is a system diagram illustrating an embodiment of a satellite receiver set-top box system that is built according to the invention.

FIG. 10 is a system diagram illustrating an embodiment of a satellite receiver set-top box system that is built according to the invention. The satellite receiver set-top box system includes an advanced modulation satellite receiver that is implemented in an all digital architecture. The satellite receiver set-top box system includes a satellite tuner that receives a signal via the L-band. The satellite tuner extracts I,Q (in-phase and quadrature) components from a signal received from the L-band and provides them to the advanced modulation satellite receiver. The advanced modulation satellite receiver includes an embodiment of the decoder. The decoder is operable to support a single stage implementation of min*, max*, min and/or max to perform state metric calculation in soft-in soft-out (SISO) decoding operations according to the invention.

The advanced modulation satellite receiver communicatively couples to an HDTV MPEG-2 (Motion Picture Expert Group) transport de-mux, audio/video decoder and display engine. Both the advanced modulation satellite receiver and the HDTV MPEG-2 transport de-mux, audio/video decoder and display engine communicatively couple to a host Central Processing Unit (CPU). The HDTV MPEG-2 transport de-mux, audio/video decoder and display engine also communicatively couples to a memory module and a conditional access functional block. The HDTV MPEG-2 transport de-mux, audio/video decoder and display engine provides HD video and audio output that may be provided to an HDTV display.

The advanced modulation satellite receiver is a single-chip digital satellite receiver supporting the decoder that is operable to support the support the single stage implementation of min*, max*, min and/or max to perform state metric calculation in soft-in soft-out (SISO) decoding operations according to the invention. The advanced modulation satellite receiver is operable to receive communication provided to it from a transmitter device that includes an encoder as well.

In addition, several of the following Figures describe particular embodiments that may be used to implement the various embodiment of a single stage implementation of min*, max*, min and/or max that may be employed to perform state metric calculation in soft-in soft-out (SISO) decoding operations according to the invention.

Figure 11:
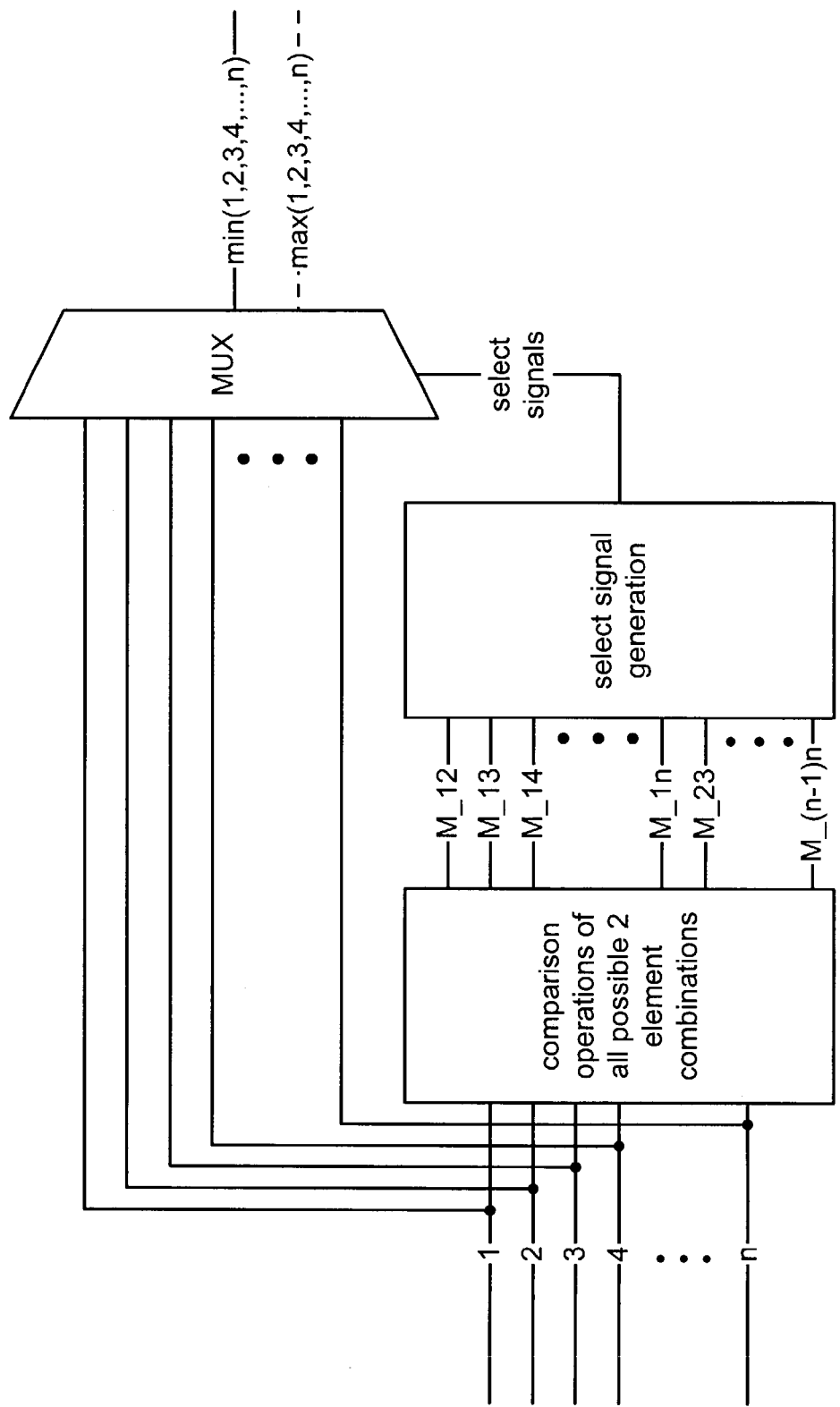
FIG. 11 is a diagram illustrating an embodiment of a single stage min (or max) design that is built according to the invention.

FIG. 11 is a diagram illustrating an embodiment of a single stage min (or max) design that is built according to the invention. The comparison functional block performs comparison of each 2 element combinations of the inputs. For example, comparison is performed using the first two inputs. Then comparison is performed using the third and fourth inputs. This process continues until comparisons have been made for all 2 element combinations of the inputs. These comparisons may be performed to determine either the largest input or the smallest input from among each of the 2 element combinations of the inputs. That is to say, this is a single stage implementation may be performed in either a min (or max) design.

The result of the processing by the comparison functional block is the generation of a number of comparison results. These comparison results may subsequently be used to generate one or more select signals. A select signal generation functional block employs the comparison results to generate the one or more select signals. The select signal generation functional block receives all of the results from comparisons performed on the 2 element combinations of the inputs.

All of the inputs are also provided to a MUX. The one or more of select signal is then provided to the MUX that receives each of the inputs and that selects the min input (or the max input, depending upon the particular embodiment) from among all of the inputs based on the one or more select signals. The selected output from the MUX will then be the select signal generation functional block receives all of the results from comparisons performed on the 2 element combinations of the inputs.

Figure 1:
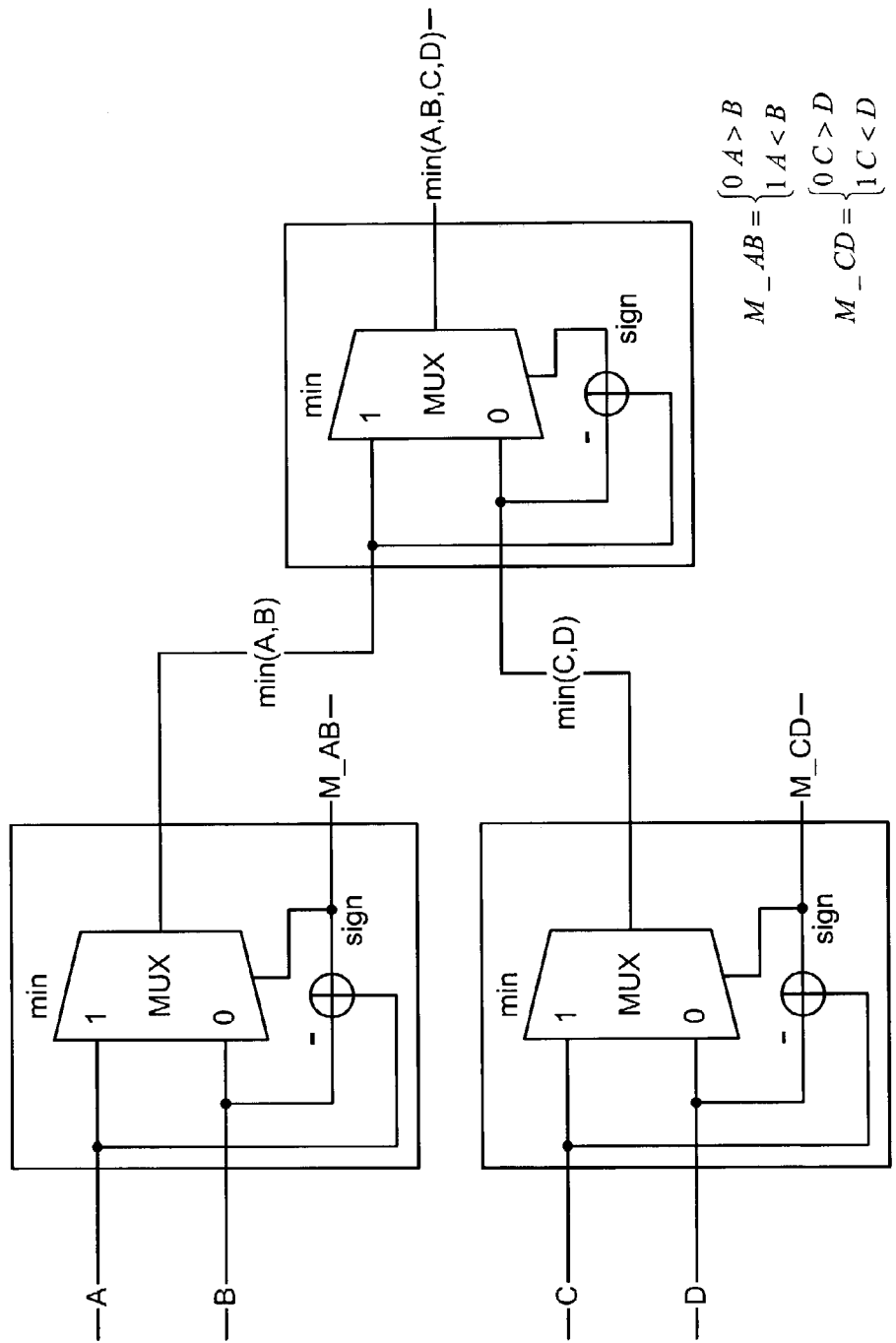
FIG. 1 is a diagram illustrating a prior art embodiment of min(A,B,C,D) calculation functionality.

When viewing, this implementation of the single stage min (or max) design, it can be seen that the comparison operations of all of the 2 element combinations of the inputs may be performed simultaneously and in parallel. This will provide for radically increased operational speed when compared to a serially implementation device. When viewing this single stage implementation, it can be seen that the longest processing delay within this embodiment includes the processing of a subtractor (to perform the comparison operations), some logic gates (to process the comparison results), and a MUX (that receives the one or a select signals and actually selects the min (or max) input). When compared to the prior art calculation functionality of min (or max) within FIG. 1, it can be seen that the single stage design shown here is much faster.

It is also noted here that if this design is to be used for min* or max* calculations, then subtractors would most likely be more desirable to be used instead of comparators. For example a subtractor could be to calculate and the result of A−B instead of A<B (with a comparator). Therefore, the difference between 2 inputs, generated from a subtractor, could be used in the log correction value calculation within either of the min* or max* operations. It is also noted here that this single stage design (implemented as either min or max, as is appropriate) may itself form a component of either a min* or max* functional block.

Figure 12:
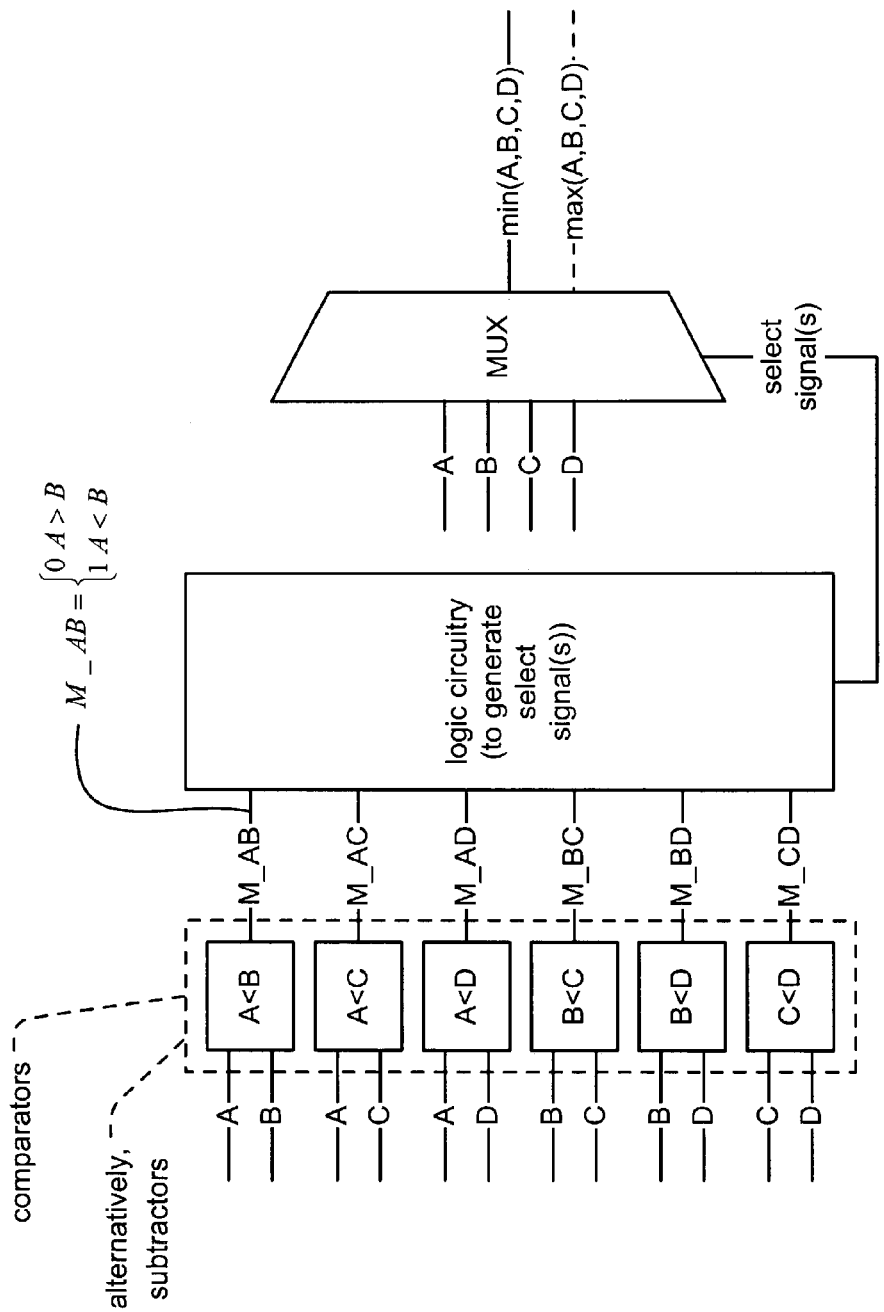
FIG. 12 is a diagram illustrating a 4 input embodiment of a single stage min (or max) design that is built according to the invention.

FIG. 12 is a diagram illustrating a 4 input embodiment of a single stage min (or max) design that is built according to the invention. This embodiment may be viewed as a particular implementation of the embodiment described within the above figure. For example, this embodiment operates on only 4 separate inputs, shown as A,B,C,D.

The operation of the calculation functionality of min(A, B,C,D) shown here may accurately be described as follows:

min($A,B,C,D$)=select the result of one of [min($A,B$), min($A,C$), min($A,D$), min($B,C$), min($B,D$), min($C,D$)], which will then output the smallest input The operation of the calculation functionality of max(A, B,C,D) shown here may actually be described as follows:

max($A,B,C,D$)=select the result of one of [max($A,B$), max($A,C$), max($A,D$), max($B,C$), max($B,D$), max($C,D$)], which will then output the largest input To perform this calculation in a fast and efficient manner, let the result of min(A,B)=M_AB=0 for A≧B and 1 for A<B. Similarly, the variables M_AC, M_AD, M_BC, M_BD, and M_CD may all be defined using similar relationships between the corresponding inputs, namely A and C for M_AC, A and D for M_AD and so on. A combination of these signals will indicate which one of the inputs (A,B,C,D) is smallest. Alternatively, if a max(A,B,C,D) implementation is desired, then the opposite comparisons may be made. Nevertheless, the hardware implementation would be similar.

As shown here, comparators may be used to perform the comparison operations on each of the 2 element combination of the inputs. The alternatively, subtractors may be implementation to perform the comparison operations. In either case, the comparison results are provided to logic circuitry that will be used to generate one or more select signals. Simultaneously, each input is provided to a MUX. The one or more select signals that is provided to the MUX will indicate which input is the largest or which input is the smallest, depending upon the particular implementation (min or max). The logic circuitry that is used to generate the one or more select signals may imply a logic circuitry table that is described in more detail below.

Figure 13:
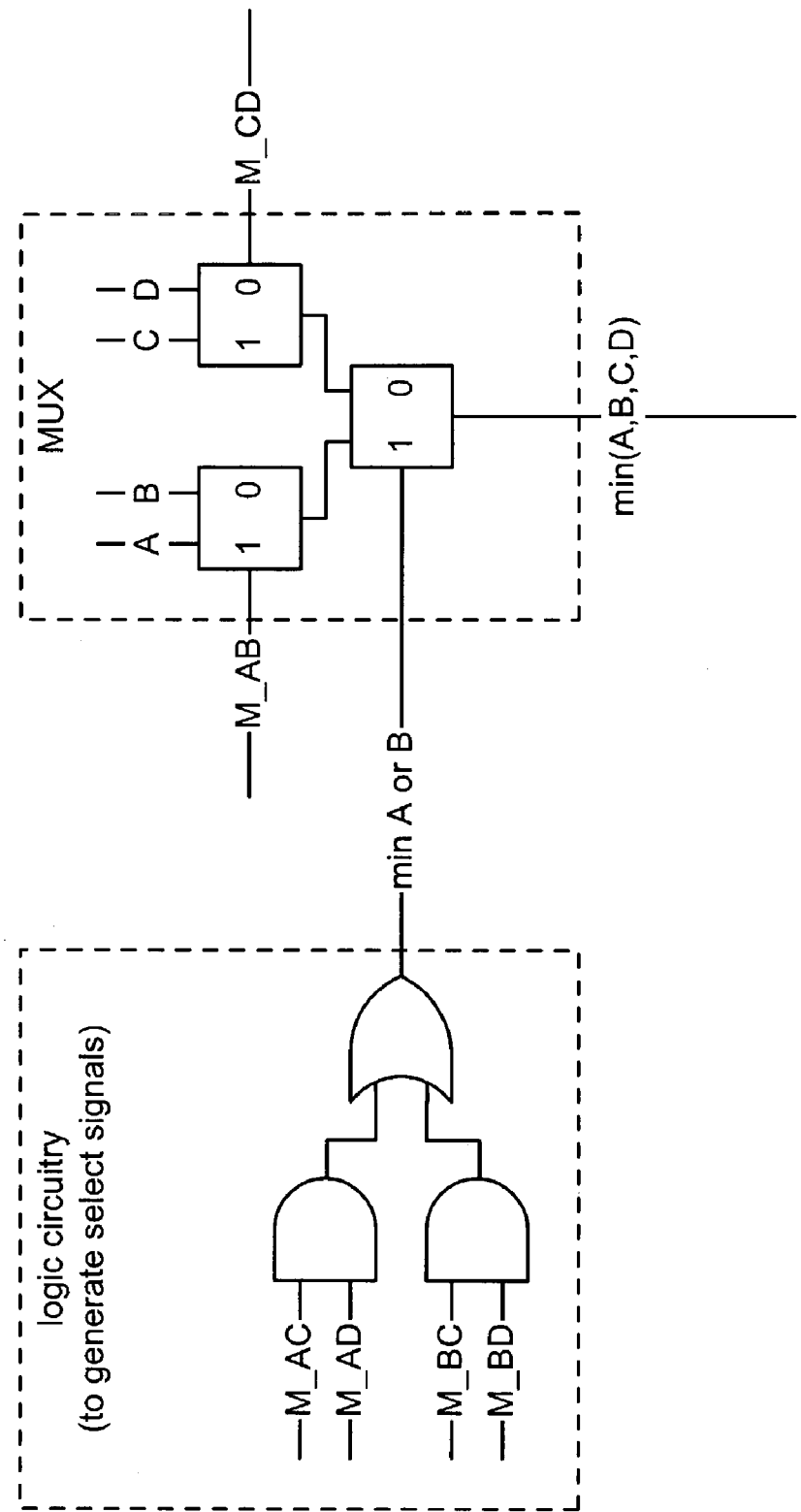
FIG. 13 is a diagram illustrating one possible implementation of the 4 input embodiment of the single stage min (or max) design of the FIG. 12.

FIG. 13 is a diagram illustrating one possible implementation of the 4 input embodiment of the single stage min (or max) design of the FIG. 12. This embodiment shows one possible way in which the single stage design, for min in this example, may be implemented. As shown here, inputs are provided to a MUX that receives three separate select signals. The comparison results, that have been that generated using comparators, or subtractors, or by whichever means desired within the particular embodiment, are provided to the logic circuitry. The logic circuitry generates a determination of whether the smallest input, from among A,B,C,D, is in the group of A,B (meaning the smallest value is either A or B) or in the group of C,D (meaning the smallest value is either C or D); this determination is shown as the signal min A or B. The logic circuitry is implemented using two AND gates and an OR gate. The first AND gate receives the comparison results of M_AC and M_AD. The second AND gate receives the comparison result of M_BC and M_BD. By using the definitions described above as min(A, B)=M_AB=0 for A≧B and 1 for A<B [this example being for the 2 element combination of inputs A and B], then the logic circuitry will generate the select signal that indicates which input is smaller among A and B.

The logic circuitry operation within this embodiment may be described as follows:

min $A$ or $B$=($M\_AC$ AND $M\_AD$) OR ($M\_BC$ AND $M\_BD$)

These logical operations are shown within the logic circuitry above this 4 input embodiment.

The four inputs that are provided to the MUX, A,B,C,D, are implemented as follows: A and B are provided to a MUX whose selection signal is M_AB, and C and D are provided to a MUX whose selection signal is M_CD.

Therefore, the outputs of these two preliminary MUXes are provided to a final MUX whose selection signal indicates which input is smaller among A,B,C,D. Therefore, the output of this final MUX will be the smallest from among all of the inputs A,B,C,D. It is noted that each of the three MUXes within the MUX are 2 to 1 MUXes. The operational speed of this embodiment, even for only four inputs, will be much faster than the prior art approach of performing calculations serially. Clearly, this embodiment is just one way in which the single stage design may be implemented. Another possible implementation is below.

Figure 14:
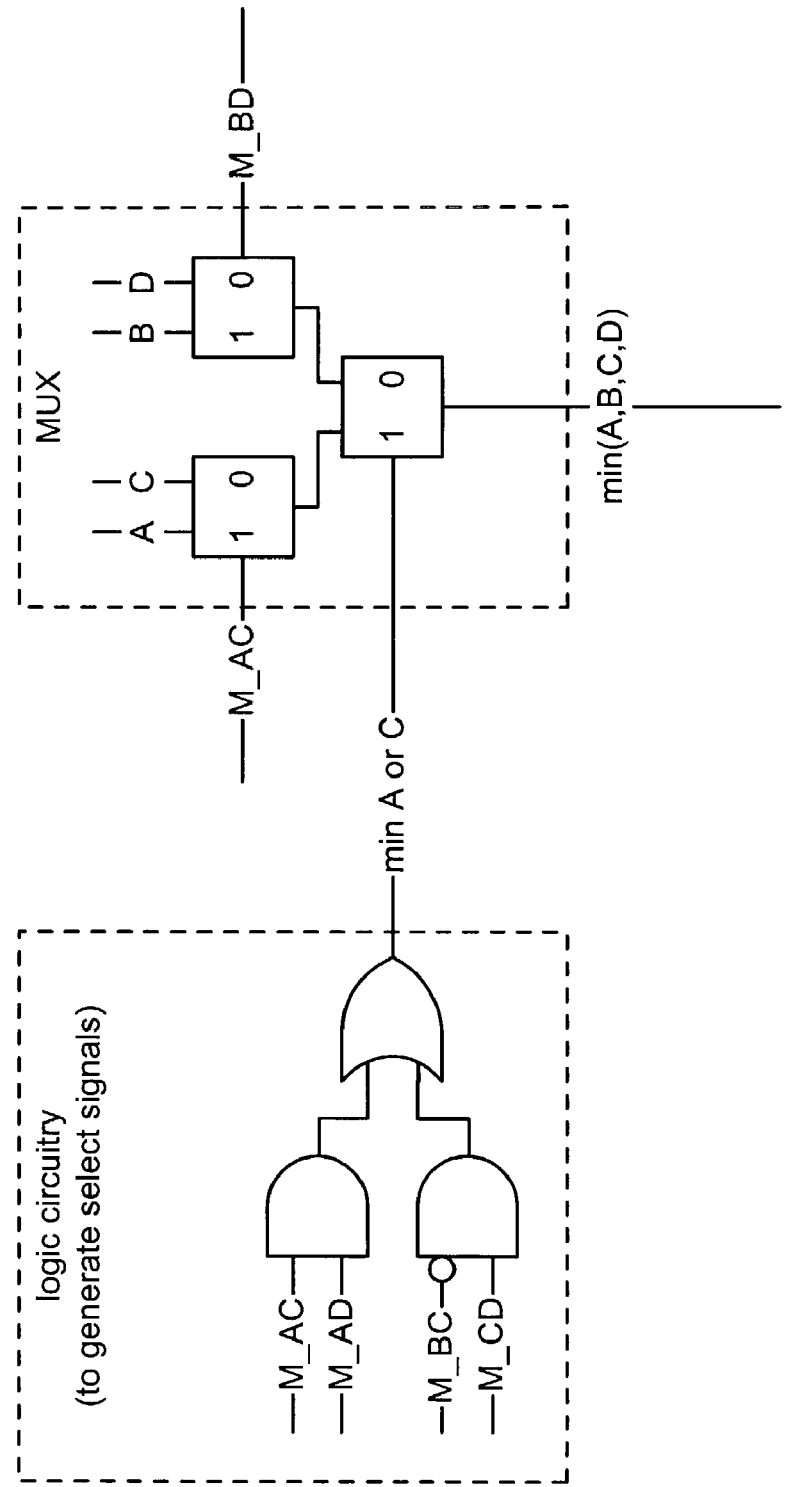
FIG. 14 is a diagram illustrating another possible implementation of the 4 input embodiment of the single stage min (or max) design of the FIG. 12.

FIG. 14 is a diagram illustrating another possible implementation of the 4 input embodiment of the single stage min (or max) design of the FIG. 12. Within this embodiment, the selection provided by the logic circuitry is shown as being the signal min A or C which is analogous to the signal shown as min A or B within the preceding figure. For example, the logic circuitry generates a determination of whether the smallest input, from among A,B,C,D, is in the group of A,C (meaning the smallest value is either A or C) or in the group of B,D (meaning the smallest value is either B or D); this determination is shown as the signal min A or C.

This will of course require the proper alignment of the inputs to the MUX. In addition, there is a modification that must be performed within the logic circuitry.

The logic circuitry operation within this embodiment may be described as follows:

min A or C=(M_AC AND M_AD) OR (M_BC AND M_BD)

These logical operations are shown within the logic circuitry above this 4 input embodiment.

The four inputs that are provided to the MUX, A,B,C,D, are implemented as follows: A and C are provided to a MUX whose selection signal is M_AC, and B and D are provided to a MUX whose selection signal is M_BD.

Again, there are a variety of ways in which the single stage design may be implemented to accommodate multiple inputs. These figures show just two possible implementations. Other modifications may be performed to a common eight more or fewer numbers of inputs without departing from the scope and spirit of the invention.

FIG. 15 is a table diagram illustrating a logic circuitry table that may be employed for the 4 input embodiment of the single stage min (or max) design of the FIG. 12. The logic circuitry table shown here shows what the select signals, defined as being either the smallest of (A or B) or the smallest of (A or C), will be based upon which of the inputs is smallest. A combination of these M_xx (where xx is AB, AC, and so on) signals will indicate which one of the inputs is smallest. Only those necessary signals are shown within this logic circuitry table. Those signals whose values are "don't care" are not shown. This logic circuitry table may be employed within either of the embodiments described within the preceding 2 figures.

Figure 2:
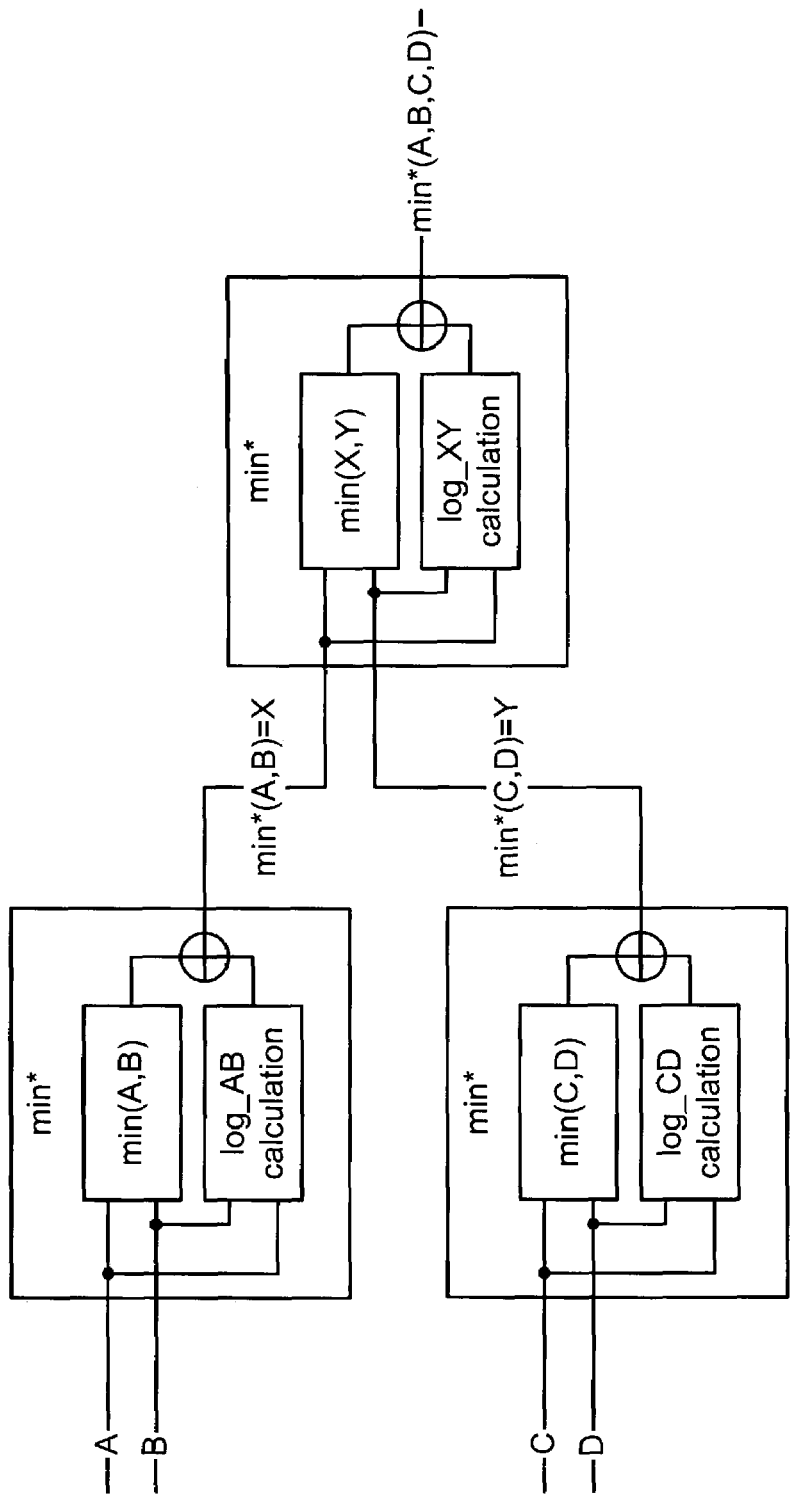
FIG. 2 is a diagram illustrating a prior art embodiment of min*(A,B,C,D) calculation functionality.

Before getting into more detail in how a single stage implementation of min* (or max*) may be achieved according to the invention, the reader is again referred back to FIG. 2 for a reference of how the prior art calculation functionality of min* is most typically performed. As is clearly shown within the prior art FIG. 2, as the number of inputs increases, the operational speed of such a prior design will fall off considerably. Again, as in the above, many designs for which operational speed is a high priority, log correction value calculation is simply not performed. Only a min (or max) calculation is performed with the inherent reduction of accuracy. One aspect of the invention is that, by providing a single stage implementation, many calculations may be performed in parallel thereby maintaining a high degree of accuracy and also ensuring a very fast operational speed. Those devices that employ the single stage aspects of the invention will benefit from the very fast operational speed and also the very high degree of accuracy. It is also noted that the degree of accuracy provided with performing min* or max* calculations may be programmable based upon a particular application's need. For example, the precision of log correction values may be programmable so that only one of a finite number of possible values is allowed. Similarly, the difference between two separate log correction values may also be programmable so that only a finite number of possible value differences are allowed. In doing so, the difference between two separate log correction values may be performed without a subtractor.

In addition, as is also be seen in greater detail below, the parallel nature in which the single stage implementation is achieved, is a large part of what provides the very fast operational speed that allows the invention's single stage design to be used within to any case and systems that require very fast processing. One beneficial aspect of the invention provides, among others, is the fact that very fast processing may be provided while ensuring a high degree of accuracy. Moreover, the degree of that accuracy, in terms of bits or precision or some other parameter, may be programmable by a user.

It is noted that, in the equations shown below, a constant value (CV) offset may be employed to avoid the need to use 2s complement format thereby reducing the circuit complexity. If no offset is desired, then the constant value (CV) offset may be set to zero.

The calculations that are performed may be described as follows:

$\min^*(A,B) = \min(A,B) - \ln(1+\exp{-|A-B|}) + $ constant value (CV)

$\min^*(A,B) = \min(A,B) + \log\_AB$, where log_AB may be viewed as the log correction value To perform a min* operation on 4 inputs, A,B,C,D, then the calculations may be described as follows:

$\min^*(A,B,C,D) = \min^*[\min^*(A,B), \min^*(C,D)]$; this may be viewed as being 2 stages of performing min* calculations.

$\min^*(A,B,C,D) = \min^* \{[\min(A,B)+\log\_AB],[\min(C,D)+\log\_CD]\}$ $\min^*(A,B,C,D) = \min\{[\min(A,B)+\log\_AB], [\min(C,D)+\log\_CD]\} - \ln[1+\exp{-|\min(A,B)+\log\_AB-\min(C,D)-\log\_CD|}] + $ constant value (CV)

$\min^*(A,B,C,D) = \min\{[(A+\log\_AB), (B+\log\_AB), (C+\log\_CD), (D+\log\_CD)] + \log\_AB\_CD$ Within these equations, the variables are defined as follows:

$\log\_AB = -\ln(1+\exp{-|A-B|}) + $ constant value (CV)

$\log\_CD = -\ln(1+\exp{-|C-D|}) + $ constant value (CV)

$\log\_AB\_CD = -\ln[1+\exp{-|\min(A,B)+\log\_AB-\min(C,D)-\log\_CD|}] + $ constant value (CV)

Within this illustrative example, for the 4 possible scenarios when comparing the inputs for A,B,C,D, the value for log_AB_CD (referred to as the final log correction value) may be further simplified.

$\log\_AB\_CD = -\ln[1+\exp{-|A+\log\_AB-C-\log\_CD|}] + $ constant value (CV); for $A<B$ and $C<D$ $\log\_AB\_CD = -\ln[1+\exp{-|A+\log\_AB-D-\log\_CD|}] + $ constant value (CV); for $A<B$ and $C>D$ $\log\_AB\_CD = -\ln[1+\exp{-|B+\log\_AB-C-\log\_CD|}] + $ constant value (CV); for $A>B$ and $C<D$ $\log\_AB\_CD = -\ln[1+\exp{-|B+\log\_AB-D-\log\_CD|}] + $ constant value (CV); for $A>B$ and $C>D$ These possible values may all be calculated simultaneously and then the upper value for log_AB_CD may then be selected depending upon the relationship between the inputs. For example, the actual value that will be employed for the final log value calculation (log_AB_CD) will be selected based upon the relationship between the inputs. Therefore, the final log value calculation may be performed for all four possibilities, and the relationship between the inputs may be ascertained in parallel. Thereafter, the relationship between the inputs will be used to select the proper value for the final log correction value.

Continuing on with the simplification of the equations described above, the min*(A,B,C,D) may be further simplified as being a first value (min_out) and a second value (e.g., the final log correction value log_AB_CD).

$$\min{}^*(A,B,C,D)=\min\{[(A+\log\_AB), (B+\log\_AB), (C+\log\_CD), (D+\log\_CD)]+\log\_AB\_CD$$

$$\min{}^*(A,B,C,D)=\min\_out+\log\_AB\_CD$$

Therefore, another way to express the 4 possible values for min*(A,B,C,D) is as follows:

$$\min{}^*(A,B,C,D)=A+\log\_AB+\log\_AB\_CD, \text{ if } A+\log\_AB \text{ is smallest}$$

$$\min{}^*(A,B,C,D)=B+\log\_AB+\log\_AB\_CD, \text{ if } B+\log\_AB \text{ is smallest}$$

$$\min{}^*(A,B,C,D)=C+\log\_CD+\log\_AB\_CD, \text{ if } C+\log\_CD \text{ is smallest}$$

$$\min{}^*(A,B,C,D)=D+\log\_CD+\log\_AB\_CD, \text{ if } D+\log\_CD \text{ is smallest}$$

Therefore, all 4 possible values for min*(A,B,C,D) may be calculated simultaneously and in parallel. In addition, the relationship between the input values may be ascertained while these 4 possible values are being calculated. This parallel processing approach will provide for an increase in operational speed. Once the relationship between the inputs is determined, then the appropriate value for min*(A,B,C,D) may be selected from among the 4 possible values for min*(A,B,C,D).

There are a variety of ways in which the simplifications to the min* calculations may be implemented. In addition, it is noted that similar simplifications be made to perform max* calculations As well without departing from the scope and spirit of the invention. The max* calculation is shown below:

$$\max{}^*(A,B)=\max(A,B)+\ln(1+\exp{-|A-B|})+\text{constant value (CV)}$$

$$\max{}^*(A,B)=\max(A,B)+\log\_AB, \text{ where } \log\_AB \text{ may be viewed as the log correction value}$$

To perform a max* operation on 4 inputs, A,B,C,D, then the calculations may be described as follows:

$$\max{}^*(A,B,C,D)=\max{}^*[\max{}^*(A,B),\max{}^*(C,D)]; \text{ this may be viewed as being 2 stages of performing max* calculations.}$$

$$\max{}^*(A,B,C,D)=\max{}^* \{[\max(A,B)+\log\_AB], [\max(C,D)+\log\_CD]\}$$

$$\max{}^*(A,B,C,D)=\max \{[\max(A,B)+\log\_AB], [\max(C,D)+\log\_CD]\}+\ln[1+\exp{-|\max(A,B)+\log\_AB-\max(C,D)-\log\_CD|}]+\text{constant value (CV)}$$

$$\max{}^*(A,B,C,D)=\max\{[(A+\log\_AB), (B+\log\_AB), (C+\log\_CD), (D+\log\_CD)]+\log\_AB\_CD$$

Within these equations, the variables are defined as follows:

$$\log\_AB=\ln(1+\exp{-|A-B|})+\text{constant value (CV)}$$

$$\log\_CD=\ln(1+\exp{-|C-D|})+\text{constant value (CV)}$$

$$\log\_AB\_CD=\ln[1+\exp{-|\max(A,B)+\log\_AB-\max(C,D)-\log\_CD|}]+\text{constant value (CV)}$$

Within this illustrative example, for the 4 possible scenarios when comparing the inputs for A,B,C,D, the value for log_AB_CD (referred to as the final log correction value) may be further simplified.

$$\log\_AB\_CD=\ln[1+\exp{-|A+\log\_AB-C-\log\_CD|}]+\text{constant value (CV); for } A>B \text{ and } C>D$$

$$\log\_AB\_CD=\ln[1+\exp{-|A+\log\_AB-D-\log\_CD|}]+\text{constant value (CV); for } A>B \text{ and } C<D$$

$$\log\_AB\_CD=\ln[1+\exp{-|B+\log\_AB-C-\log\_CD|}]+\text{constant value (CV); for } A<B \text{ and } C>D$$

$$\log\_AB\_CD=\ln[1+\exp{-|B+\log\_AB-D-\log\_CD|}]+\text{constant value (CV); for } A<B \text{ and } C<D$$

Continuing on with the simplification of the equations described above, the max*(A,B,C,D) may be further simplified as being a first value (max_out) and a second value (e.g., the final log correction value log_AB_CD).

$$\max{}^*(A,B,C,D)=\max \{[(A+\log\_AB), (B+\log\_AB), (C+\log\_CD), (D+\log\_CD)]+\log\_AB\_CD$$

$$\max{}^*(A,B,C,D)=\max\_out+\log\_AB\_CD$$

Therefore, another way to express the 4 possible values for max*(A,B,C,D) is as follows:

$$\max{}^*(A,B,C,D)=A+\log\_AB+\log\_AB\_CD; \text{ when A is largest}$$

$$\max{}^*(A,B,C,D)=B+\log\_AB+\log\_AB\_CD; \text{ when B is largest}$$

$$\max{}^*(A,B,C,D)=C+\log\_CD+\log\_AB\_CD; \text{ when C is largest}$$

$$\max{}^*(A,B,C,D)=D+\log\_CD+\log\_AB\_CD; \text{ when D is largest}$$

Therefore, all 4 possible values for max*(A,B,C,D) may be calculated simultaneously and in parallel. In addition, the relationship between the input values may be ascertained while these 4 possible values are being calculated. This parallel processing approach will provide for an increase in operational speed. Once the relationship between the inputs is determined, then the appropriate value for max*(A,B,C,D) may be selected from among the 4 possible values for max*(A,B,C,D).

Figure 16A:
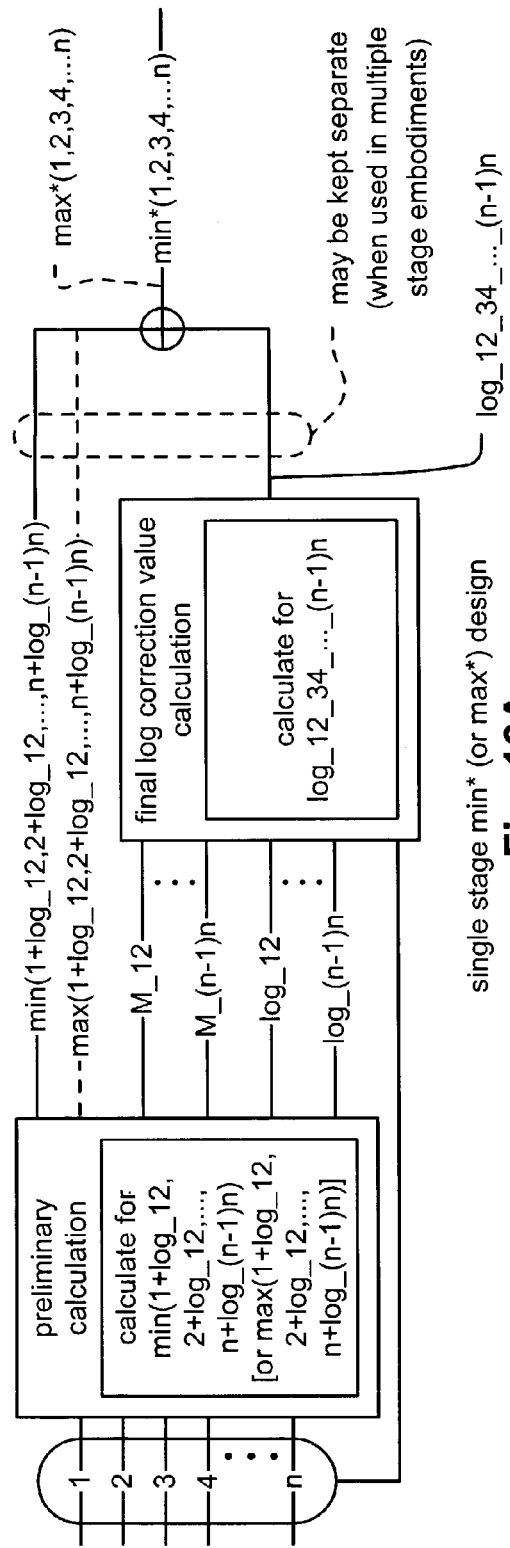
FIG. 16A is a diagram illustrating an embodiment of a single stage min* (or max*) design that is built according to the invention.

FIG. 16A is a diagram illustrating an embodiment of a single stage min* (or max*) design that is built according to the invention. Comparing this embodiment to that described above within the prior art calculation functionality of FIG. 2, the single stage design is much faster. The prior art calculation functionality of FIG. 2 includes 2 separate stages of min calculation, log correction value calculation, and an adder. This is true within each of the 2 separate stages. Compared to the single stage design shown here for min* (or max*) calculation functionality, the invention employs only one stage of min, log correction value calculation, and an adder in addition to some level of multiplexing. Therefore, the single stage solution provided by the invention to perform the calculation functionality of min* (or max*) is much faster.

A number of inputs are provided to a preliminary calculation functional block. The preliminary calculation of functional block calculates a number of log correction values corresponding to two elements combinations of the inputs. Each of these two element long correction values corresponds to at least one of the inputs. For example, a log correction value depicted as log_12 corresponds to inputs 1 and 2. This preliminary calculation functional block also calculates min results or max results that correspond to two elements combinations of the inputs. The preliminary calculation functional block then adds each 2 element log correction value to its corresponding input thereby it generating a number of possible values. The preliminary calculation functional block then determines either a min result or a max result using these possible values.

After the appropriate processing has been performed by the preliminary calculation functional block and the final log correction value calculation functional block, then the min result, or the max results, and the final log correction value are summed together to calculate either the min*, or max*, result. However, it is also noted that these values that are to be summed together may be kept separate for use in subsequent processing stages. For example, some embodiments may be implemented using a number of stages. In some circumstances, it may be desirable to keep these values separate and also to avoid the processing delay introduced by the adder at this particular point in the processing.

Figure 16B:
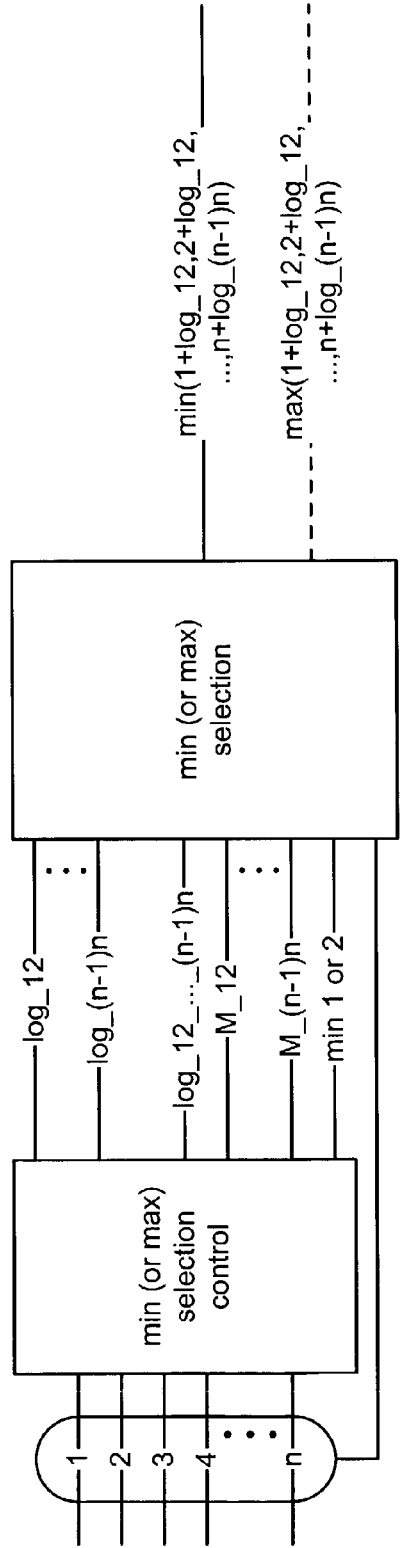
FIG. 16B is a diagram illustrating an embodiment of the preliminary calculation functional block of the single stage min* (or max*) design of the FIG. 16A.

FIG. 16B is a diagram illustrating an embodiment of the preliminary calculation functional block of the single stage min* (or max*) design of the FIG. 16A. The embodiment shown here of the preliminary calculation functional block includes two separate functional blocks. The first functional block it is a min selection control functional block (or a max selection control functional block), and the second to functional block is a min selection functional block (or a max selection functional block). All of the inputs are provided to both functional blocks.

The min (or max) selection control functional block calculates a number of 2 element log correction values. Each of these 2 element log correction of values corresponds to at least one of the inputs. The min (or max) selection control functional block also calculates a final log correction value that is to be used to calculate all of the possible values for min* or max*. The min (or max) selection control functional block also provides sign bit outputs after performing comparisons of pairs of input values. The sign bit outputs may be performed similarly as it is above with respect to min (or max) embodiments.

Figure 17A:
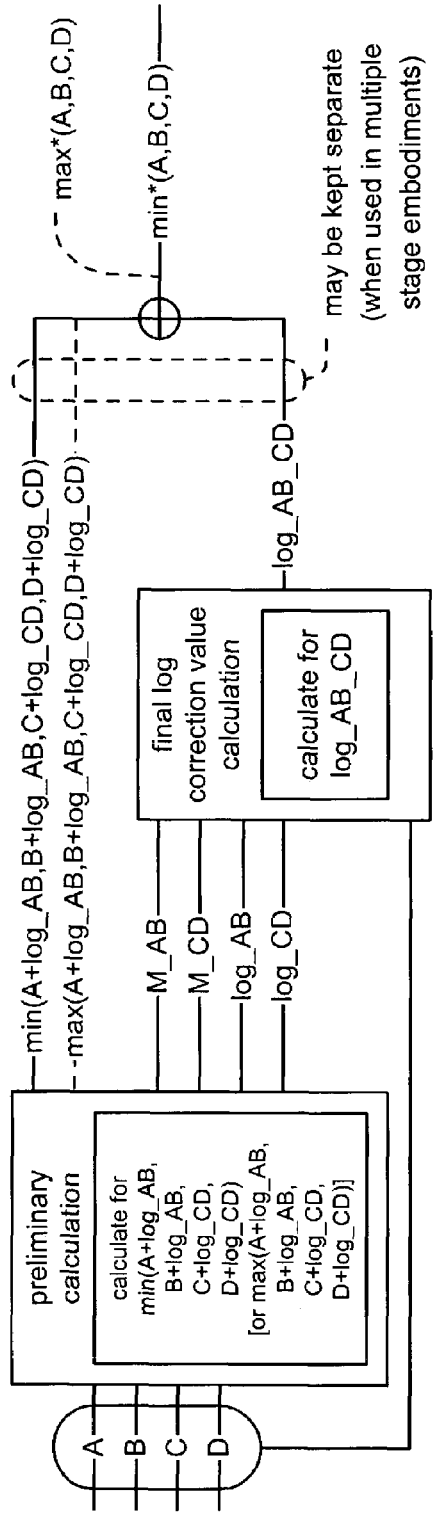
FIG. 17A is a diagram illustrating a 4 input embodiment of a single stage min* (or max*) design that is built according to the invention.

For example, let the result of min(A,B)=M_AB=0 for A≧B and 1 for A<B. Similarly, the variables M_AC, M_AD, M_BC, M_BD, and M_CD may all be defined using similar relationships between the corresponding inputs, namely A and C for M_AC, A and D for M_AD and so on. In addition, the min (or max) selection control functional block determines the largest, or smallest (depending upon what they're the embodiment is max or min), of a 2 element pair of inputs. The min (or max) selection functional block will operate in to determine which value should be selected while the min (or max) selection control functional block is processing. The output of the min (or max) Selection functional block may be viewed as follows:

min*(1,2,3,4, . . . , $n$)=min_out+
    log__12__34_ . . . _($n$−1)$n$; or max*(1,2,3,4, . . . , $n$)=max_out+
    log__12__34_ . . . _($n$−1)$n$ FIG. 17A is a diagram illustrating a 4 input embodiment of a single stage min* (or max*) design that is built according to the invention. This embodiment may be viewed as being a particular embodiment of the embodiment shown above within the FIG. 16A. In this example, for inputs are simultaneously provided to a preliminary calculation functional block and a final log correction value calculation functional block. From the preliminary calculation functional block, 2 element log correction values are provided to the final log correction value calculation functional block. In addition, sign bits are provided from the preliminary calculation functional block to the final log correction value calculation functional block that will indicate in the relationship between the four input values. The processing within each of these functional blocks may be performed simultaneously and in parallel. The final log correction value functional block provides the output log_AB_CD. The preliminary calculation functional block adds each 2 element log correction value to its corresponding input thereby generating a plurality of possible values. The preliminary calculations functional block then performs a min (or max) operation on these 4 possible values. The resultant will be the smallest of these 4 possible values, to calculate the ultimate max* or min* result of the four inputs, these two values are summed together. However, it is also noted that these values may be kept separate for use in subsequent stages, as also described above within other embodiments.

Figure 17B:
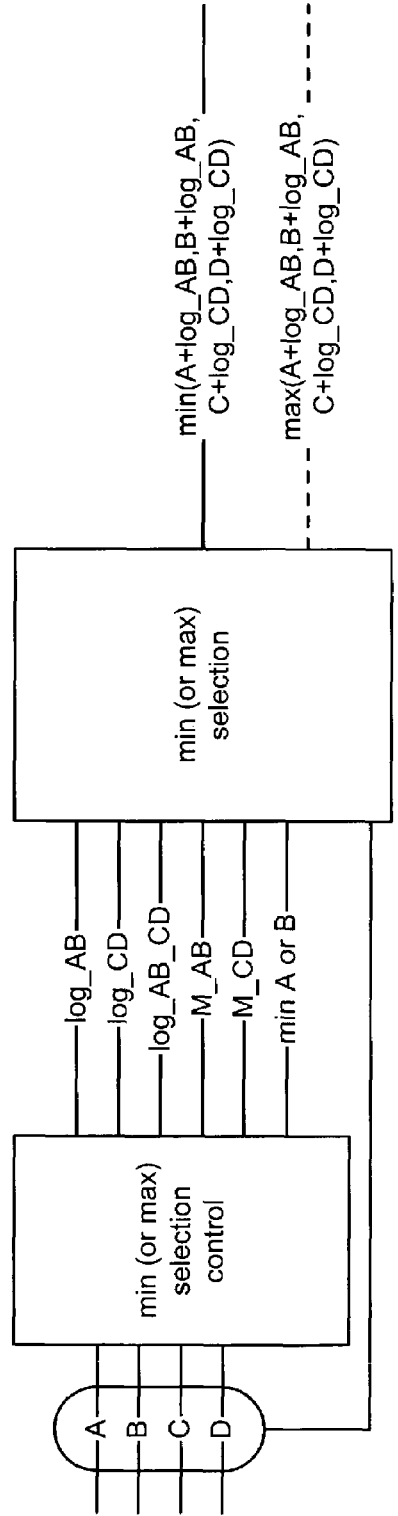
FIG. 17B is a diagram illustrating an embodiment of the preliminary calculation functional block of the 4 input embodiment of the single stage min* (or max*) design of the FIG. 17A.

FIG. 17B is a diagram illustrating an embodiment of the preliminary calculation functional block of the 4 input embodiment of the single stage min* (or max*) design of the FIG. 17A. This embodiment may be viewed as being a particular embodiment of the embodiment shown above within the FIG. 16B. The operations described within this FIG. 17B are analogous to those operations performed within the FIG. 16B.

Specifically, the 4 inputs are simultaneously provided to the min (or max) selection control functional block and also to the min or max selection functional block. The min (or max) selection control functional block provides 2 element log correction values that correspond to at least one input. In addition, the min (or max) selection control functional block provides sign bits that indicate the relationship between the four input values. The min (or max) selection control functional block also determines which input is smaller from among a two element pair of inputs, specifically between A and B. This min A or B is provided to the min (or max) selection functional block.

Figure 18:
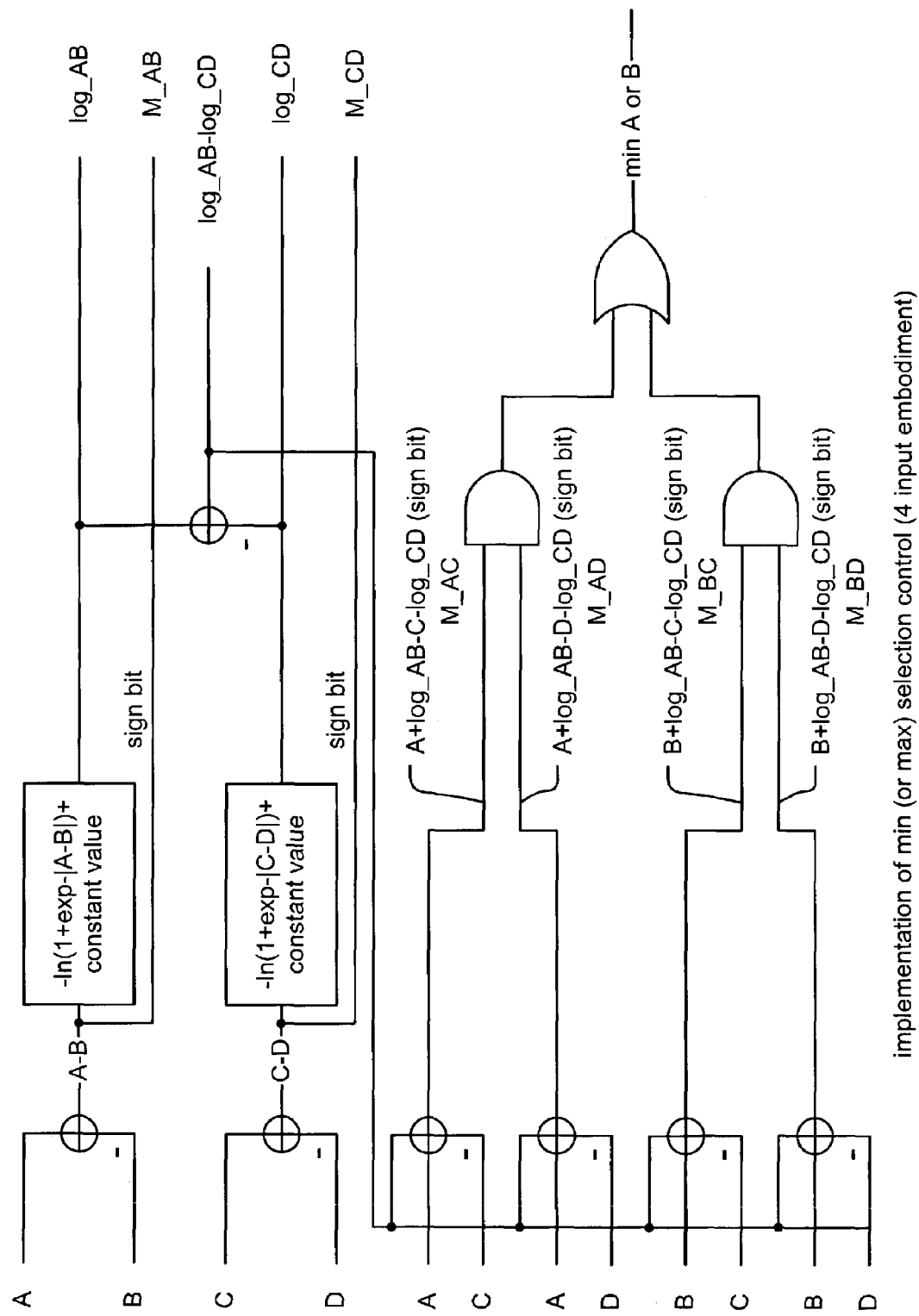
FIG. 18 is a diagram illustrating one possible implementation of the min (or max) selection control for the 4 input embodiment of the single stage min* (or max*) design of the FIG. 17B.

FIG. 18 is a diagram illustrating one possible implementation of the min (or max) selection control for the 4 input embodiment of the single stage min* (or max*) design of the FIG. 17B. This particular embodiment illustrates one possible way to implement the min, or max, selection control functional block for a 4 input embodiment. The differences between the inputs of A and B are calculated, and the differences between the inputs of C and D are calculated. Then, using these differences, the values for the variable of −ln(1+exp−|A−B|) and the variable of −ln(1+exp−|C−D|) are calculated. These resultant values may be viewed as 2 element log correction values. In addition, the sign bits, indicating the relationship between the two, for each of these 4 input values is calculated, and they are shown as M_AB and M_CD.

The difference between the 2 element log correction values (log_AB−log_CD) is used and summed with the differences between the input values as well. The value of A+log_AB−C−log_CD is calculated; the value of A+log_AB−D−log_CD is calculated; the value of B+log_AB−C−log_CD is calculated; and the value of B+log_AB−D−log_CD is calculated. The sign bits of these values are provided to AND gates and the outputs of those AND gates are provided to an OR gate that will provide indication of which input pair, A,B or C,D, in fact includes the min value (meaning the min value is either A or B or the min value is either C or D); this is shown as the output from the OR gate as the signal min A or B. Alternatively, the design could be implemented to determine the max value from among the four inputs A,B,C,D.

Figure 19:
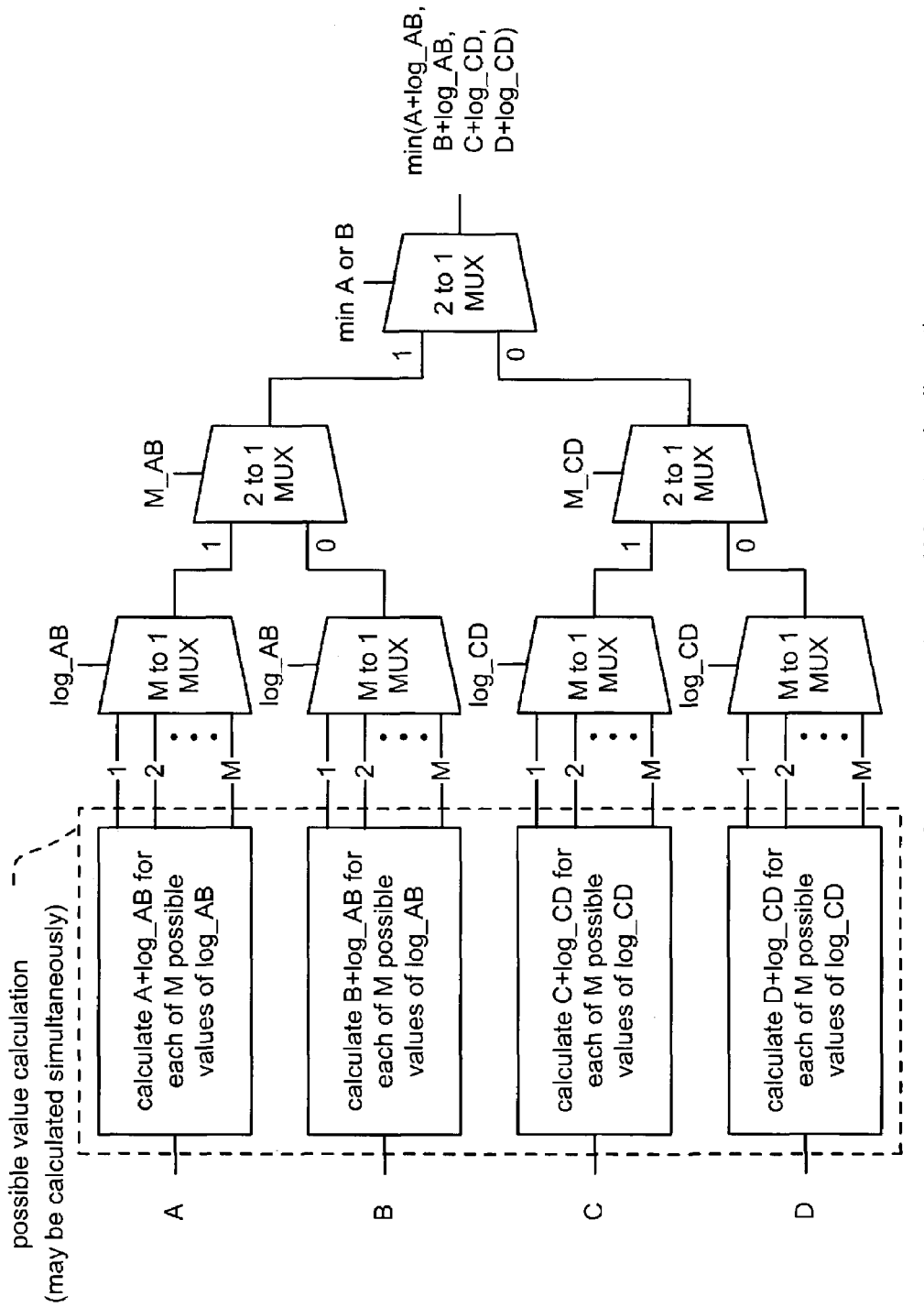
FIG. 19 is a diagram illustrating one possible implementation of the min (or max) selection for the 4 input embodiment of a single stage min* (or max*) design of the FIG. 17B.

FIG. 19 is a diagram illustrating one possible implementation of the min (or max) selection for the 4 input embodiment of a single stage min* (or max*) design of the FIG. 17B. Four possible values are calculated in parallel within this embodiment. These four values correspond to the 4 possible values of A+log_AB, B+log_AB, C+log_CD, and D+log_CD that are described in more detail above. It is also noted here that these 4 values are calculated for each of the M possible values of the 2 element log correction value that corresponds to the respective input. For example, the 2 element log correction value log_AB corresponds to the inputs of both A and B. Similarly, the 2 element log correction value log_CD corresponds to the inputs of both C and D. All of the M possible values for each of these 4 possible values of A+log_AB, B+log_AB, C+log_CD, and D+log_CD are provided to a number of M to 1 MUXes. The selection for each of these MUXes is made by the 2 element log correction value that corresponds to that particular input. For example, the log correction value log_AB is used to perform the selection for both of the top two MUXes that deal with the inputs for A and B. Similarly, the log correction value log_CD is used to perform the selection for both of the bottom MUXes that deal with the inputs for C and D.

The outputs of these 4 preliminary MUXes are provided to 2 separate 2 to 1 MUXes whose selection is made based on the sign bit that corresponds to those inputs. For example, the selection for the top 2 to 1 MUX is made based upon the sign bit M_AB that corresponds to the inputs for A and B. Similarly, the selection for the bottom 2 to 1 MUX is made based upon the sign bit M_CD that corresponds to the inputs for C and D. The outputs from each of these two MUXes is provided to a final MUX whose selection is based on the minimum valued input as being either A or B (as determined and by the operation of min A or B). It is also noted here that the order of the M to 1 MUXes, whose selection is made by the log correction values associated with the A and B inputs (log_AB) and the log correction values associated with the C and D inputs (log_CD) may be swapped with the 2 separate 2 to 1 MUXes, whose selection is based on the sign bits M_AB and M_CD, ballot departing from the scope and spirit of the invention.

Several of the embodiments described below perform the single stage implementation using an approximation approach that reduces the complexity and processing delay without distinguishable loss of performance. This approximation may be described as follows:

$$\min[A+\log\_AB, B+\log\_AB, C+\log\_CD, D+\log\_CD] \approx \min(A,B,C,D)+(\log\_AB \text{ OR } \log\_CD)$$

Continuing on with this approximation (using a 4 input example for illustration), the following relationships may be defined:

$$\min{}^*(A,B,C,D)=\min{}^*\{[\min(A,B)+\log\_AB], [\min(C,D)+\log\_CD]\}$$

$$\min{}^*(A,B,C,D)=\min\{[\min(A,B)+\log\_AB], [\min(C,D)+\log\_CD]\}-\ln[1+\exp-|\min(A,B)+\log\_AB-\min(C,D)-\log\_CD|]+\text{constant value (CV)}$$

$$\min{}^*(A,B,C,D)=\min[(A+\log\_AB), (B+\log\_AB), (C+\log\_CD), (D+\log\_CD)]+\log\_AB\_CD$$

$$\min{}^*(A,B,C,D)\approx\min(A,B,C,D)+[\log\_AB \text{ OR } \log\_CD]+\log\_AB\_CD$$

Here, the 2 element log correction values log_AB and log_CD may be defined as follows:

$$\log\_AB=-\ln(1+\exp-|A-B|)+\text{constant value (CV)}$$

$$\log\_CD=-\ln(1+\exp-|C-D|)+\text{constant value (CV)}$$

Here, the final log correction value log_AB_CD may be defined as follows:

$$\log\_AB\_CD=-\ln(1+\exp-|\min(A,B)+\log\_AB-\min(C,D)-\log\_CD|)+\text{constant value (CV)}$$

Moreover, the final log correction value may have one of four possible values depending upon the relationships between the 4 input values.

$$\log\_AB\_CD=-\ln(1+\exp-|A+\log\_AB-C-\log\_CD|)+\text{CV; for } A<B \text{ and } C<D$$

$$\log\_AB\_CD=-\ln(1+\exp-|A+\log\_AB-D-\log\_CD|)+\text{CV; for } A<B \text{ and } C>D$$

$$\log\_AB\_CD=-\ln(1+\exp-|B+\log\_AB-C-\log\_CD|)+\text{CV; for } A>B \text{ and } C<D$$

$$\log\_AB\_CD=-\ln(1+\exp-|B+\log\_AB-D-\log\_CD|)+\text{CV; for } A>B \text{ and } C>D$$

Therefore, another and more efficient way to evaluate the approximation for min*(A,B,C,D) is based on the relationship between the 4 input values as follows:

$$\min{}^*(A,B,C,D)=A+\log\_AB+\log\_AB\_CD; \text{ when } A \text{ is the smallest value}$$

$$\min{}^*(A,B,C,D)=B+\log\_AB+\log\_AB\_CD; \text{ when } B \text{ is the smallest value}$$

$$\min{}^*(A,B,C,D)=C+\log\_CD+\log\_AB\_CD; \text{ when } C \text{ is the smallest value}$$

$$\min{}^*(A,B,C,D)=D+\log\_CD+\log\_AB\_CD; \text{ when } D \text{ is the smallest value}$$

These 4 equations shown just above are equivalent to the approximation equation described further above and also repeated here.

$$\min{}^*(A,B,C,D)\approx\min(A,B,C,D)+[\log\_AB \text{ OR } \log\_CD]+\log\_AB\_CD$$

However, for a more efficient and faster operating implementation, these 4 equations may all be calculated simultaneously and in parallel during the same time that the determination of which input value is the smallest may be made. Therefore, all of the possible values are being calculated at the same time in which the comparison of the inputs is being made. After the comparison of all of the inputs is complete, then these 4 possible values should be available, and the appropriate selection may be made there from. One that aspect of the invention, in providing for this largely parallel implementation that is supported by the single stage design, allows for radically improved operational speed.

Clearly other embodiments may be implemented using larger numbers of inputs. In addition, this design may also be adapted to provide for max* calculations as well.

There are a variety of ways in which to implement these calculations. One such a way is to calculate the three terms of the approximation in equation simultaneously and then add them together.

$$\min{}^*(A,B,C,D)\approx\min(A,B,C,D)+[\log\_AB \text{ OR } \log\_CD]+\log\_AB\_CD$$

$$\min{}^*(A,B,C,D)\approx\text{term1}+\text{term 2}+\text{term3}$$

Figure 20:
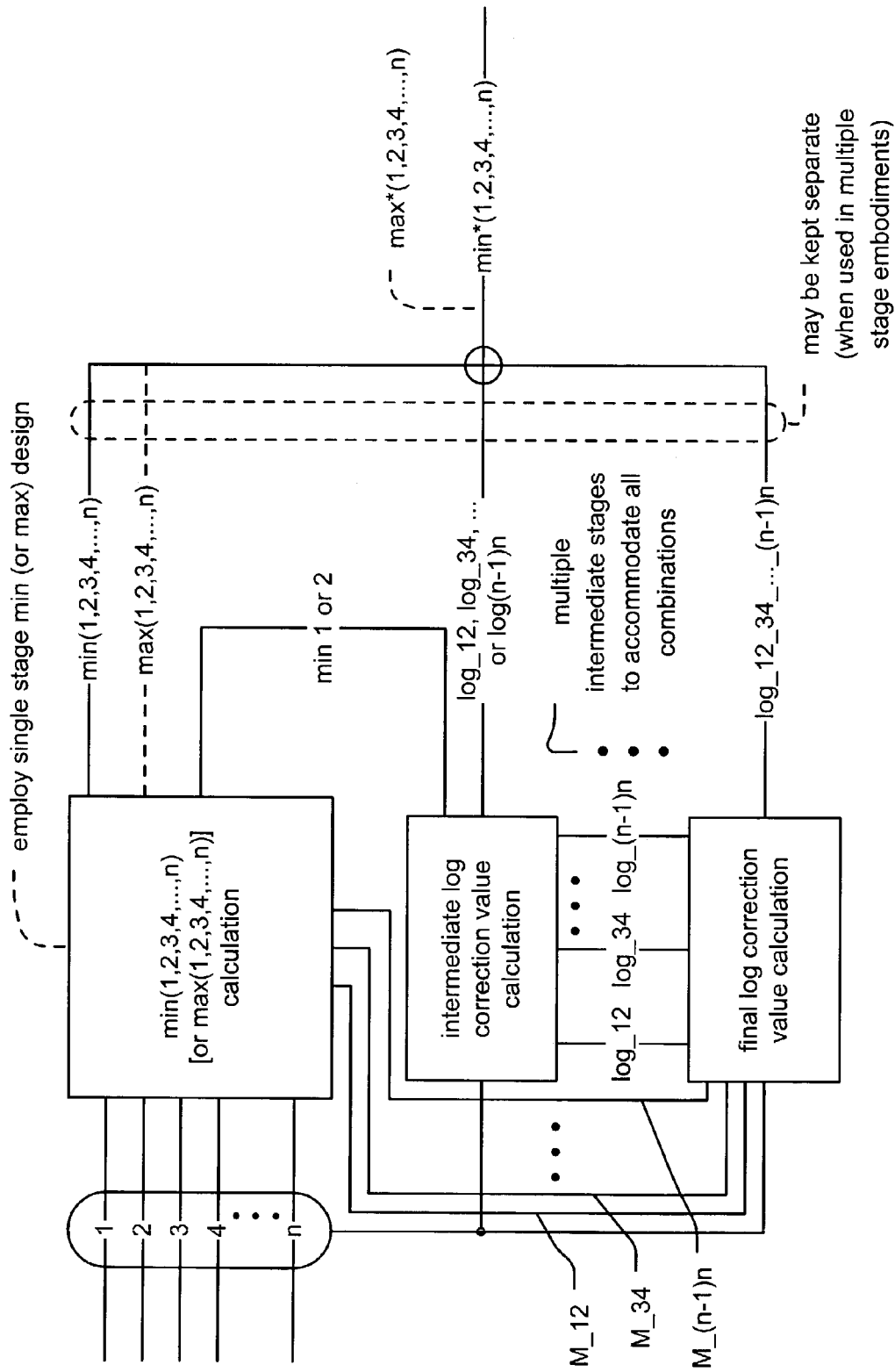
FIG. 20 is a diagram illustrating an embodiment of a single stage min* (or max*) design using approximation that is built according to the invention.

FIG. 20 is a diagram illustrating an embodiment of a single stage min* (or max*) design using approximation that is built according to the invention. This embodiment operates on n number of inputs. A min (or max) calculation functional block is employed to determine which of the inputs is the smallest or largest. This min (or max) calculation functional block may be implemented using the single stage min (or max) design described above in greater detail. Regardless of the manner in which this calculation is made, a determination of the smallest or largest input is made (shown as min(1,2,3,4, . . . , n). In addition, sign bits are generated by the min (or max) calculation functional block that will indicate the relationship of between the inputs; specifically, which ones are larger when being compared within 2 element pairs (the sign bits are shown as M__12, M__34, . . . , M_(n−1)n). In addition, a determination of a min (or max) value from among 2 element pair of inputs is made for use in selecting an appropriate intermediate log correction value. This selection signal is shown as being the min 1 or 2). This min (or max) value is provided to an intermediate log correction value calculation functional block. The intermediate log correction value functional block calculates a number of 2 element log correction values that correspond to at least one input.

Although the inputs are also provided to this intermediate log correction value calculation functional block, this design may also accommodate multiple intermediate log correction value calculation functional blocks without departing from the scope and spirit of the invention. It is noted here that the calculations within this intermediate log correction value calculation functional block may be performed simultaneously and in parallel with the determination by the min (or max) calculation functional block. In addition, all of the inputs are also provided to a final log correction value calculation functional block. This final log correction value calculation functional block also receives the sign bits from the min (or max) calculation functional block. The final log correction value functional block calculates the final log correction value that is shown that as log__12__ 34__ . . . __(n−1)n. The relationship between the inputs may be used to select the correct value for the final log correction value within the final log correction value calculation functional block.

The min (or max) value from among all of inputs, the appropriately selected 2 element log correction value provided by the one or more intermediate log correction value functional blocks, and the correct value for the final log correction value may all be summed together to calculate either the min* result or the max* result from among all of the inputs. Alternatively, these three values may be kept separate for use in multiple stage embodiments. Similar to the advantages described above within other embodiments that may be implemented as to save the processing time required to implement the adder, those same considerations may be used here. If desired, these values may be kept separate until just before a determination of the final results and is required. This way, each of the individual values may be used as required within other functional blocks.

Figure 21:
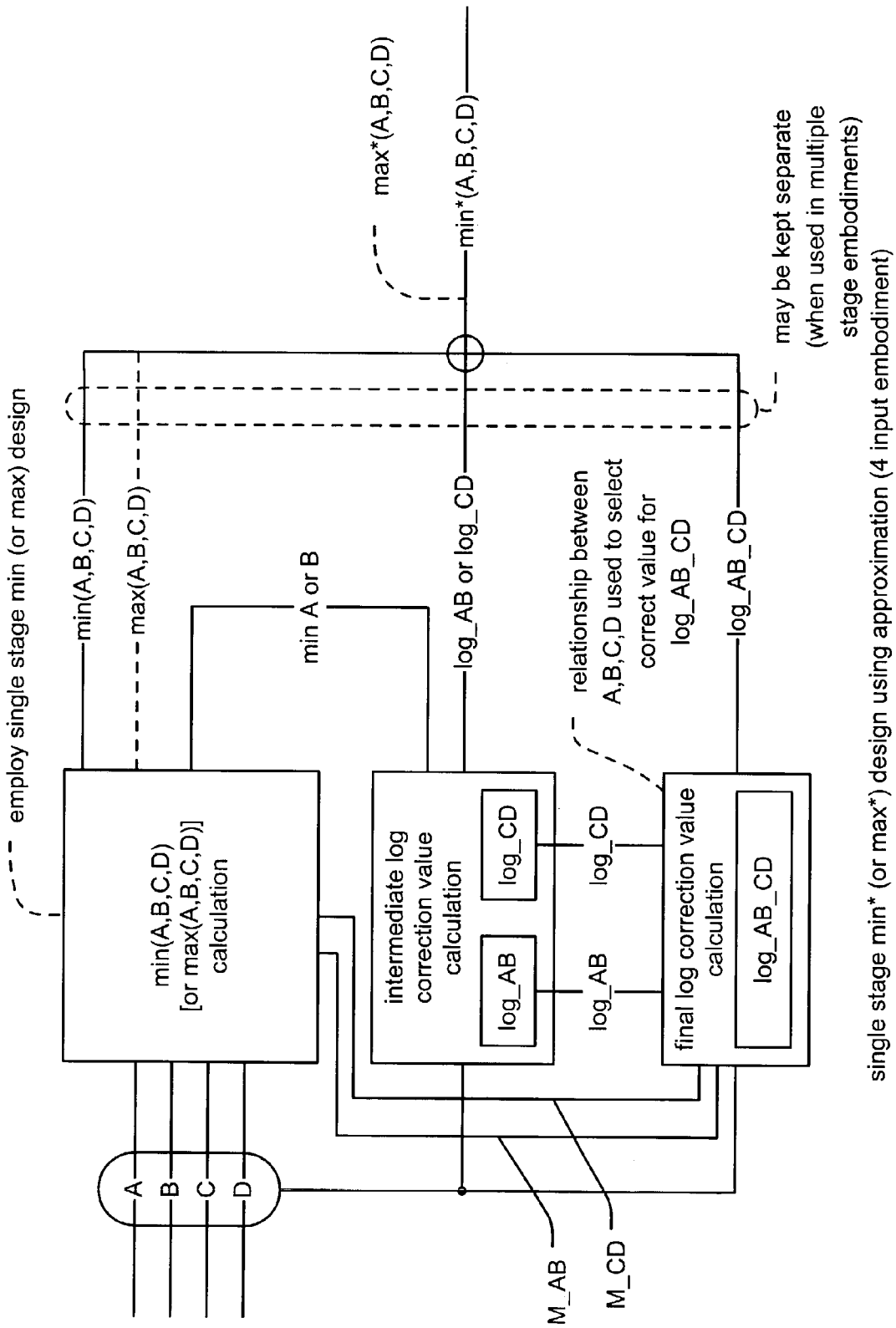
FIG. 21 is a diagram illustrating a 4 input embodiment of a single stage min* (or max*) design using approximation that is built according to the invention.

FIG. 21 is a diagram illustrating a 4 input embodiment of a single stage min* (or max*) design using approximation that is built according to the invention. Since a 4 input embodiment has been used in many places within this description, this and particular embodiment is used to illustrate precisely how a 4 input embodiment may be implemented according to the invention. This embodiment is directly if analogous to the embodiment described in the preceding figure, with the exception that only 4 inputs are being processed. Again, this single stage design may be implemented for either min* or max* processing without departing from the scope and spirit of the invention.

It is noted here that sign bits are required for the comparisons between the A and B inputs (M_AB) and for the comparisons between the C and D inputs (M_CD). In addition, only 2 intermediate log correction values must be calculated (log_AB and log_CD). The final log correction value is shown as log_AB_CD. It is also noted here that the relationship between the inputs may be used to select the correct value for the final log correction value within the final log correction value functional block.

The min (or max) value from among the 4 inputs, the appropriately selected 2 element log correction value provided by the intermediate log correction value functional block (either log_AB or log_CD), and correct value for the final log correction value (log_AB_CD) may all be summed together to calculate either the min* result or the max* result from among all of the inputs. Alternatively, these three values may be kept separate for use in multiple stage embodiments. The advantage of keeping these three values separate is described above as well.

Figure 22:
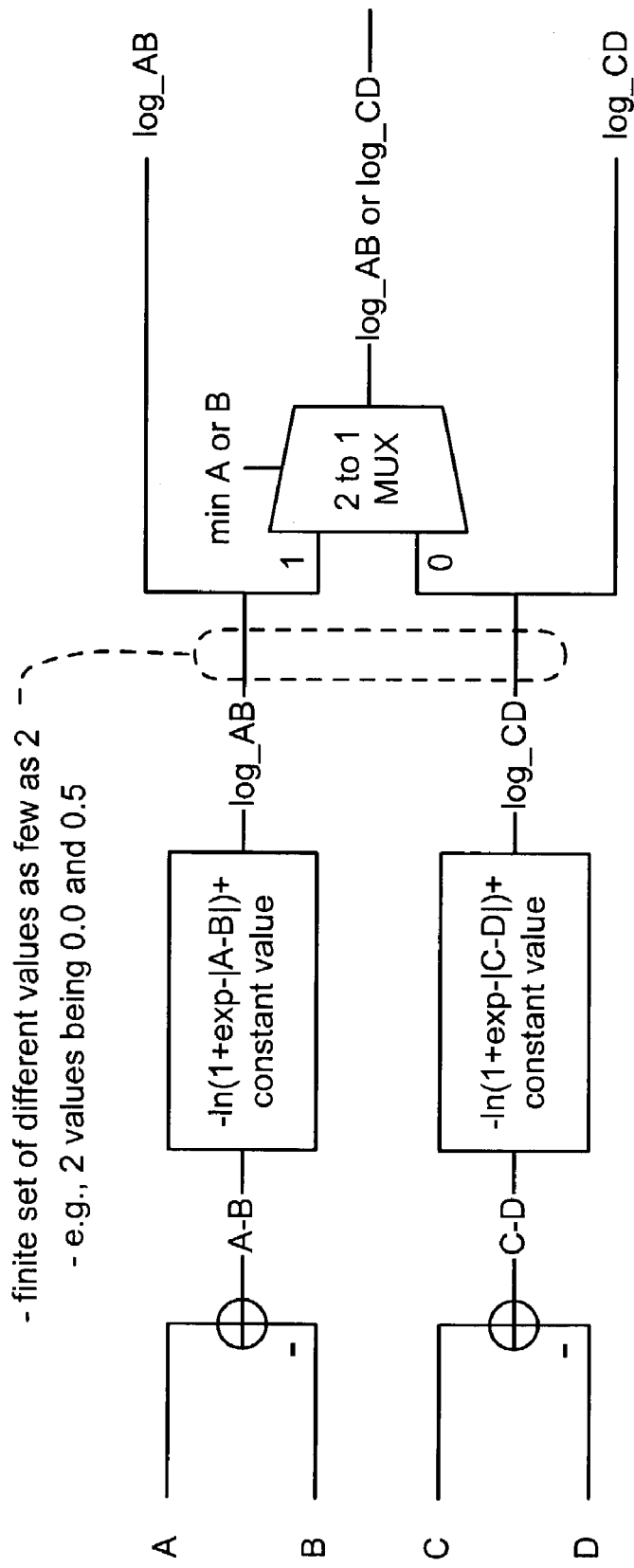
FIG. 22 is a diagram illustrating one possible implementation of the intermediate log correction value calculation for the 4 input embodiment of the single stage min* (or max*) design of the FIG. 21.

FIG. 22 is a diagram illustrating one possible implementation of the intermediate log correction value calculation for the 4 input embodiment of the single stage min* (or max*) design of the FIG. 21. This implementation shows just one way in which the intermediate log correction value calculation may be performed. Two separate subtractors are employed to determine the difference between the inputs of A and B (shown as A−B) as well as the difference between the inputs of C and D (shown as C−D). Subsequently, the 2 element log correction values are calculated for the corresponding inputs. For example, the 2 element log correction value log_AB corresponds to the inputs of A and B. Similarly, the 2 element log correction value log_CD corresponds to the inputs of C and D. These 2 element log correction values may be represented using a finite set of different values. The number of different values within this finite set maybe is few as 2. For example, the 2 different values for the 2 element log correction values may be 0.0 and 0.5 in certain embodiments. Within embodiments such that the 2 element log correction values may be implemented as having a finite number of different values, then any differences between 2 element log correction values will also have a finite number of different values. This finite number of different values may be represented as N.

For the embodiment where the 2 element log correction values log_AB and log_CD each can have two different at values of 0.0 or 0.5, then the difference between these two separate 2 element log corrections values will be one of three possible values, namely 0.0, −0.5, and +0.5. Since this difference log_AB−log_CD can have only three possible values in this embodiment, it may be calculated without a subtractor. For example, based upon the relationship of the two separate 2 element log corrections values, a Look Up Table (LUT) could be used to select the appropriate result.

A 2 to 1 MUX, whose selection is made based on the determination of which input is smaller among the inputs of A,B,C,D, will then provide the appropriate value for the intermediate log correction value.

It is also noted here that the two subtractors that are employed to determine the difference between the inputs of A and B (shown as A−B) as well as the difference between the inputs of C and D (shown as C−D) may be implemented as being the very same subtractors that may be used within a single stage min (or max) design as described above within other embodiments. Clearly, there may be large degree of sharing between the various functional blocks within an overall single stage design that is implemented according to the invention.

In addition, it is also noted that the possible values for the final log correction value may be calculated simultaneously. For example, the value of −ln[1+exp−|A−C−(log_AB+ log_CD)|]+constant value, with all of the possible values of (log_AB−log_CD) may all be calculated simultaneously. At the same time that these values are being calculated for all possible values of the difference between the 2 element log correction values, (log_AB−log_CD), then the actual value of this difference may be determined. The parallel operation of this processing provides for substantially increased operational speed when compared to a serial approach. Once the actual value for the difference between the 2 element log correction values, (log_AB−log_CD), is determined, then this value may be used to select the correct value for −(ln[1+exp−|A−C−(log_AB+log_CD)|]+constant value) based upon the correct value, the relationship between the inputs A,B,C,D may then be employed to select the correct value for the final log correction value, log_AB_CD. There are a variety of ways in which this may be implemented. Again using the 4 input embodiment for illustration, the following 3 figures show some possible ways in which this may be performed.

Figure 23:
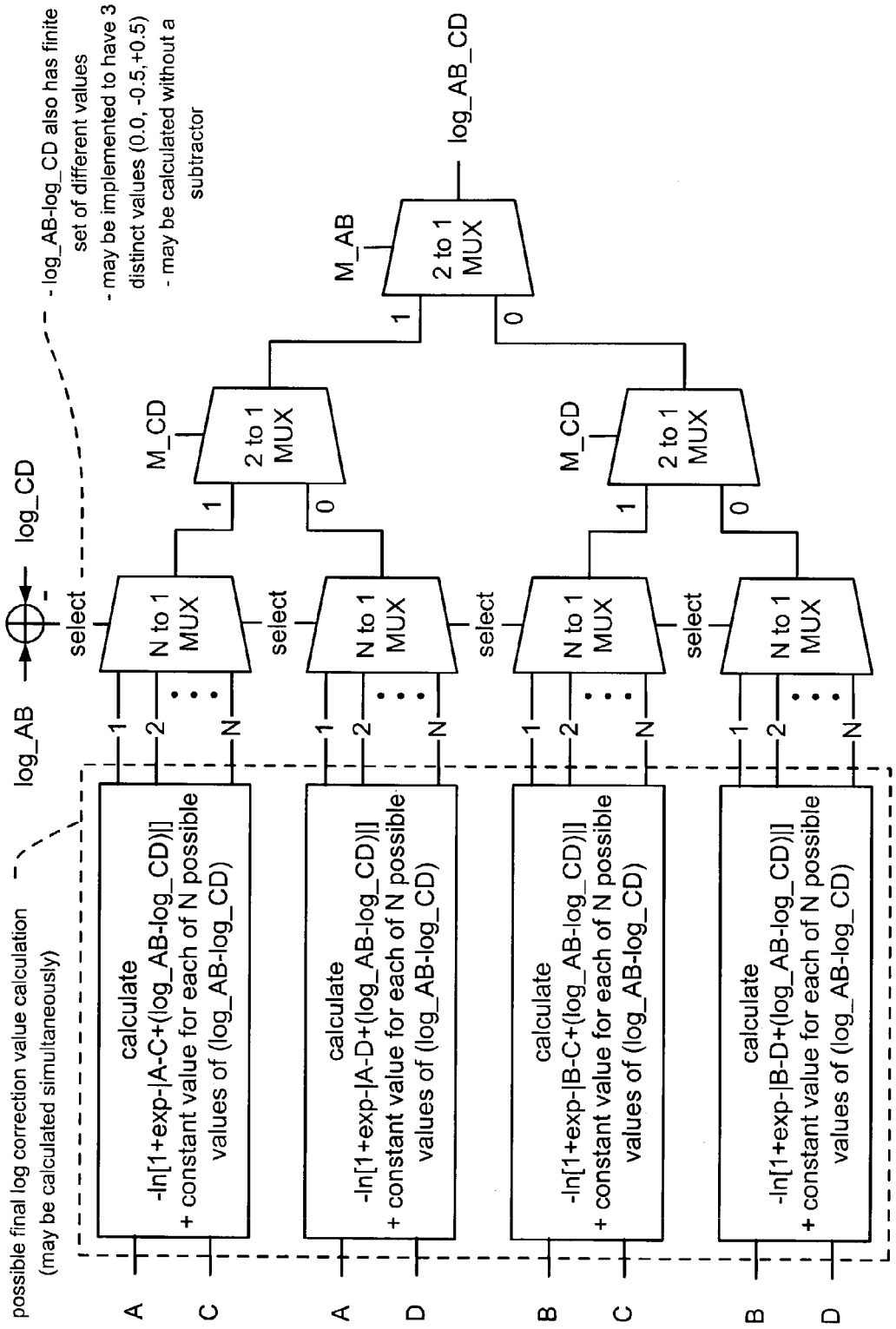
FIG. 23, FIG. 24, and FIG. 25 are diagrams illustrating 3 possible implementations, shown as an alternative #1, an alternative #2, and an alternative #3, of the final log correction value calculation for the 4 input embodiment of the single stage min* (or max*) design of the FIG. 21.
Figure 24:
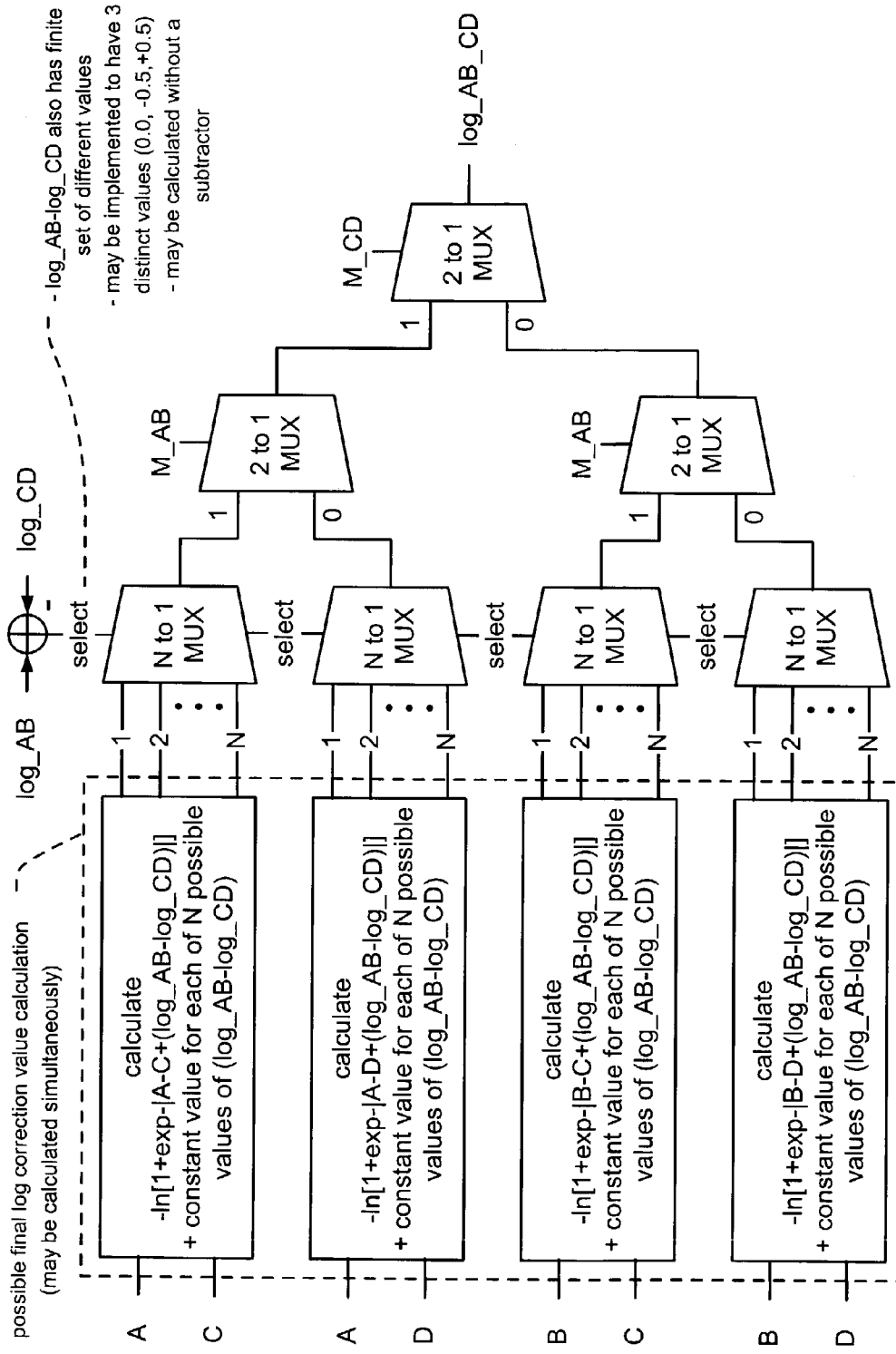
Figure 25:
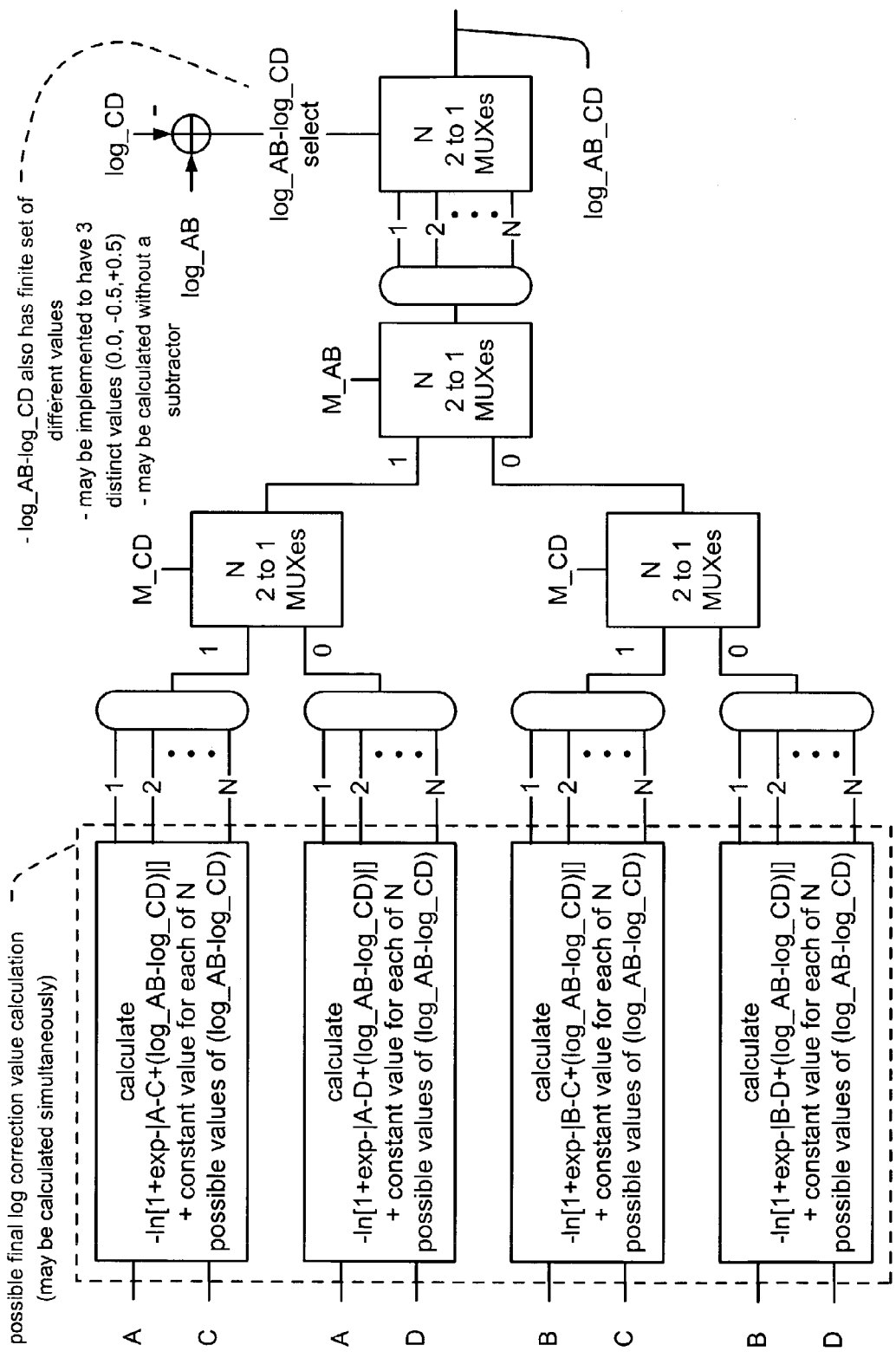

FIG. 23, FIG. 24, and FIG. 25 are diagrams illustrating 3 possible implementations, shown as an alternative #1, an alternative #2, and an alternative #3, of the final log correction value calculation for the 4 input embodiment of the single stage min* (or max*) design of the FIG. 21.

Referring to the FIG. 23, all possible final log correction values may be calculated simultaneously. These possible final log correction values correspond to all possible values of the difference between the 2 element log correction values, (log_AB−log_CD). Once these possible values have been calculated within the 4 separate possible final log correction value calculation functional blocks, then these appropriate final log correction values are passed from their respective functional blocks to N to 1 MUXes, whose selection is made based on the difference between the 2 element log correction values, (log_AB−log_CD).

The outputs of these 4 N to 1 MUXes are passed to 2 separate 2 to 1 MUXes whose selection is made based on the sign bit of the comparison of the inputs C and D, namely the value M_CD. Afterwards the outputs from these MUXes is passed to a final 2 to 1 MUX whose selection is made based on the sign bit of the comparison of the inputs A and B, namely the value M_AB.

It is again noted here that the difference between the 2 element log correction values, (log_AB−log_CD), may be implemented such as to have a finite set of different values. This finite set of different values may include 3 distinct values being 0.0, −0.5, and +0.5. As described above, borrowing upon the finite nature of such a calculation (having only 3 distinct possible results), this value may be calculated without a subtractor.

Referring to the FIG. 24, this embodiment is analogous to the previous Figure's embodiment with the exception that the multiplexing of the selection based on M_AB is performed before the multiplexing of the selection based on M_CD.

Referring to the FIG. 25, this embodiment is analogous to the embodiments of the previous two Figures with the exception that the first multiplexing is made based on the selection of M_CD, the second multiplexing is made based on the selection of M_AB, and the final multiplexing is made based on the selection of the difference between the 2 element log correction values, (log_AB−log_CD).

It is clear that there are a number of ways in which this may be implemented, and these various embodiments illustrate the fact that the order of performing the multiplexing and selection may be performed in a variety of ways without departing from the scope and spirit of the invention.

Figure 26:
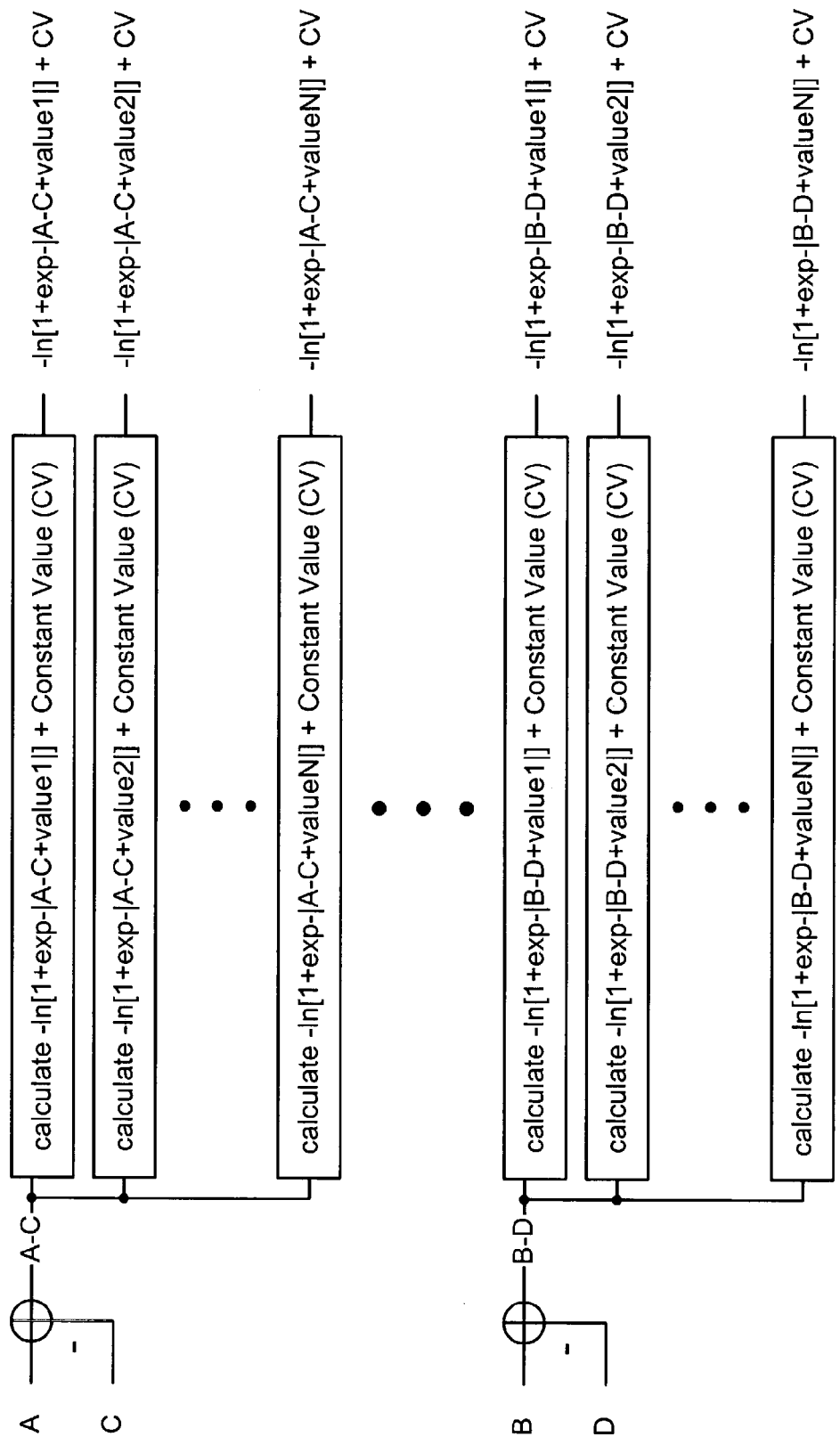
FIG. 26 is a diagram illustrating one possible implementation of the possible value calculations that may be implemented within any of the alternative #1 of the FIG. 23, the alternative #2 of the FIG. 24, and the alternative #3 of the FIG. 25.

FIG. 26 is a diagram illustrating one possible implementation of the possible value calculations that may be implemented within any of the alternative #1 of the FIG. 23, the alternative #2 of the FIG. 24, and the alternative #3 of the FIG. 25. Referring to the top of this embodiment, the difference between the inputs A and C is determined. This may be performed using the very same means employed within a single stage min (or max) design described above. It is again noted that the single stage design of the invention, borrowing upon its largely parallel nature, allows for use of similar parameters within various functional blocks of a device.

Then, the possible final log correction values correspond to all possible values of the difference between the 2 element log correction values, (log_AB−log_CD), are calculated. The possible values of the difference between the 2 element log correction values, (log_AB−log_CD), are shown as being a value1, a value 2, . . . , and a valueN.

This structure may also be repeated for the other combinations of inputs, namely, those of A and D, B and C, and B and D as described in more detail within the preceding 3 figures. It is again noted that the calculation of these possible final log correction values may be calculated simultaneously and in parallel with the determination of which difference between the 2 element log correction values, (log_AB−log_CD), is in fact the correct one.

Figure 27:
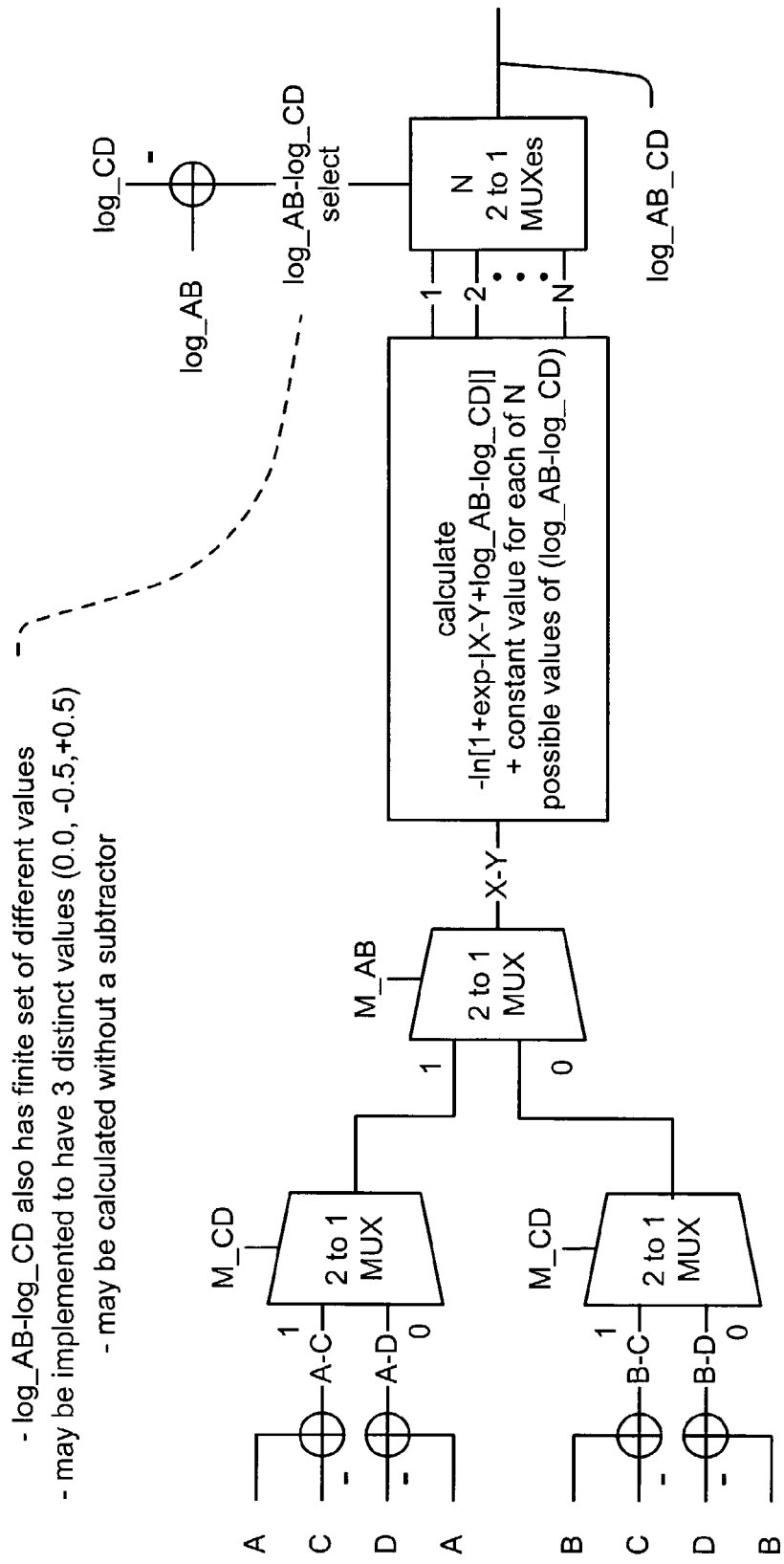
FIG. 27 is a diagram illustrating yet another possible implementation, shown as an alternative #4, of the final log correction value calculation for the 4 input embodiment of the single stage min* (or max*) design of the FIG. 21.

FIG. 27 is a diagram illustrating yet another possible implementation, shown as an alternative #4, of the final log correction value calculation for the 4 input embodiment of the single stage min* (or max*) design of the FIG. 21. The implementations of the alternative #1, #2, and #3 described above of the final log correction value calculation for the 4 input embodiment of the single stage min* (or max*) design operate as follows:

This embodiment shows an approach that may be employed to calculate the final log correction value, (log_AB_CD), by simultaneously calculating the term −ln[1+exp−|X−Y+log_AB−log_CD|]+constant value (CV) for each pair of (X,Y) to be the appropriate combination of inputs, namely, (A,C), (A,D), (B,C), and (B,D). Then, the sign bits generated from the comparison of the inputs, M_AB and M_CD, may be used to select the right combination of inputs from among (A,C), (A,D), (B,C), and (B,D).

However, within the alternative #4 described here, an alternative approach to calculating for the final log correction value, (log_AB_CD), is implemented by using the sign bits generated from the comparison of the inputs, M_AB and M_CD, to select the proper combination of inputs from among (A,C), (A,D), (B,C), and (B,D) to be used for the pair of (X,Y) before calculating the term −ln[1+exp−|X−Y+log_AB−log_CD|]+constant value (CV). Thereafter, the difference between the 2 element log correction values, (log_AB−log_CD), is employed to select the appropriate final log correction value, (log_AB_CD).

While several of these embodiments described above relate a 4 input implementation, the invention clearly envisions extending the number of inputs to a larger number or a fewer number as well. The parallel nature of the single stage implementation of the invention allows for scalability to accommodate any number of inputs.

Figure 28:
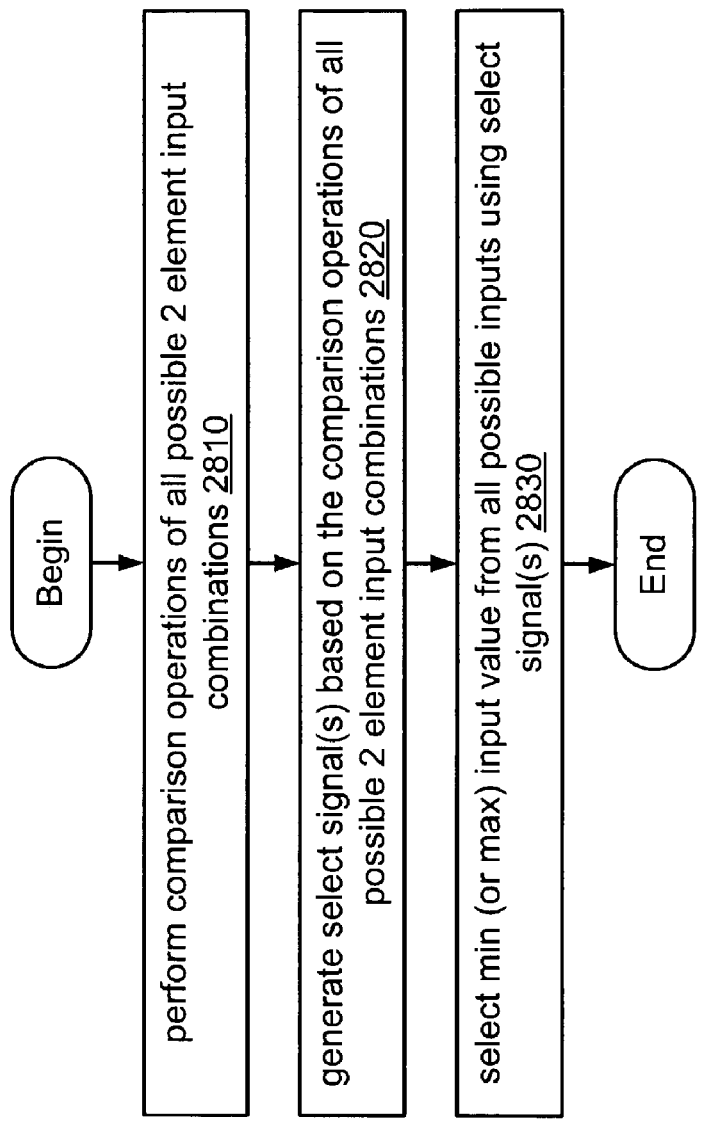
FIG. 28 is a flowchart illustrating an embodiment of a single stage min (or max) processing method that is performed according to the invention.

FIG. 28 is a flowchart illustrating an embodiment of a single stage min (or max) processing method that is performed according to the invention. Within a block 2810, comparison operations are performed for all possible 2 element input combinations. Then, the method generates one or more select signal based on the comparison operations of all possible 2 element input combinations, as shown in a block 2820. Ultimately, the method selects a min (or max) input value from all possible inputs using select signal(s), as shown in a block 2830. The single stage min (or max) processing method may be implemented using any of the single stage min (or max) designs described above.

Figure 29:
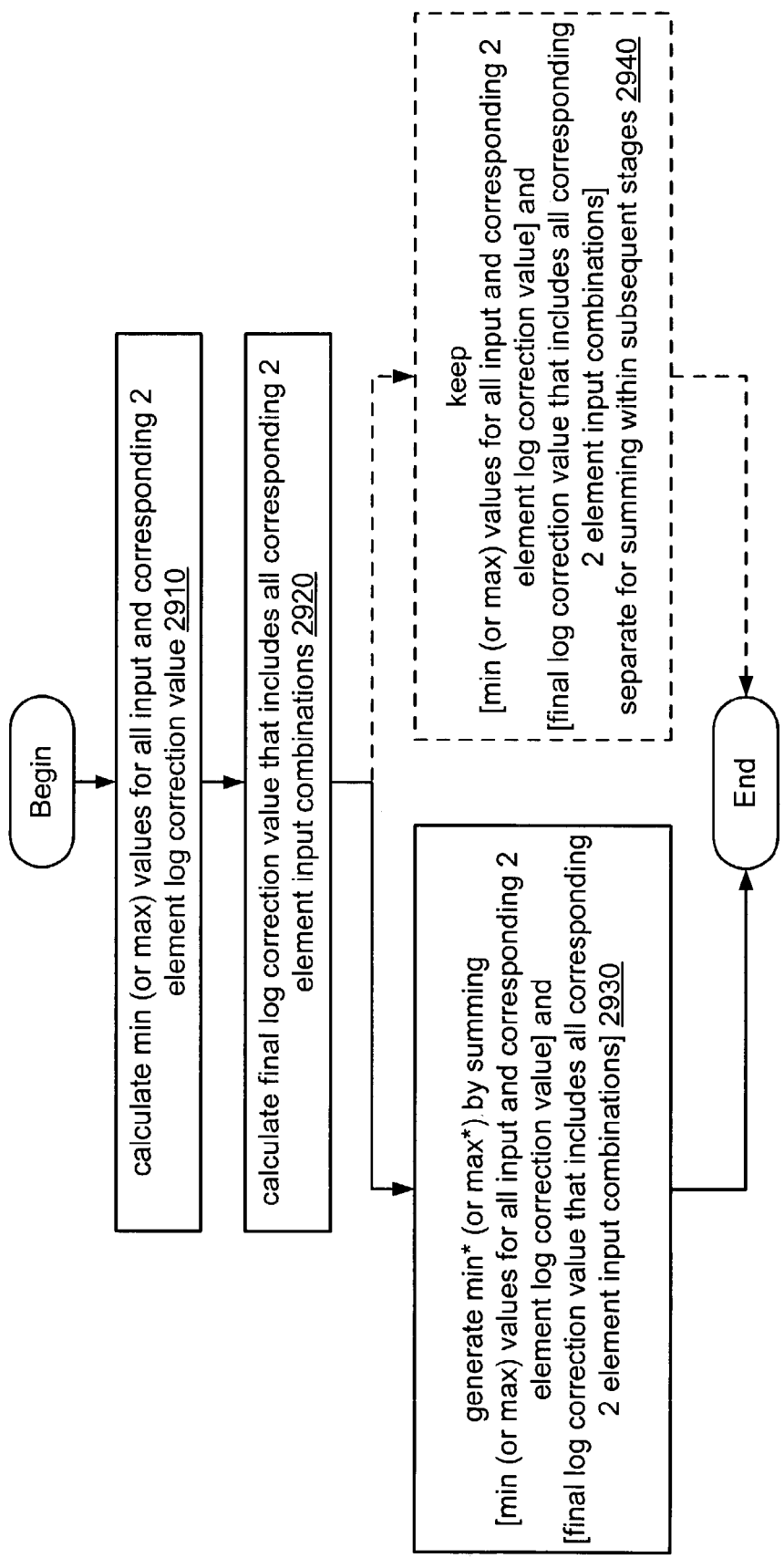
FIG. 29 is a flowchart illustrating an embodiment of a single stage min* (or max*) processing method that is performed according to the invention.

FIG. 29 is a flowchart illustrating an embodiment of a single stage min* (or max*) processing method that is performed according to the invention. The method begins by calculating min (or max) values for all input and corresponding 2 element log correction value, as shown in a block 2910. Thereafter, the method continues with calculating a final log correction value that includes all corresponding 2 element input combinations, as shown in a block 2920.

Ultimately, the method may perform one of two different operations. In one embodiment, the method generates min* (or max*) by summing [min (or max) values for all input and corresponding 2 element log correction value] and [final log correction value that includes all corresponding 2 element input combinations], as shown in a block 2930. Alternatively, in other embodiments, the method keeps [min (or max) values for all input and corresponding 2 element log correction value] and [final log correction value that includes all corresponding 2 element input combinations] separate for summing within subsequent stages, as shown in a block 2940. The keeping of these values separate may be desirable within some embodiments where the processing delay of performing addition may be performed later within the processing.

Figure 30:
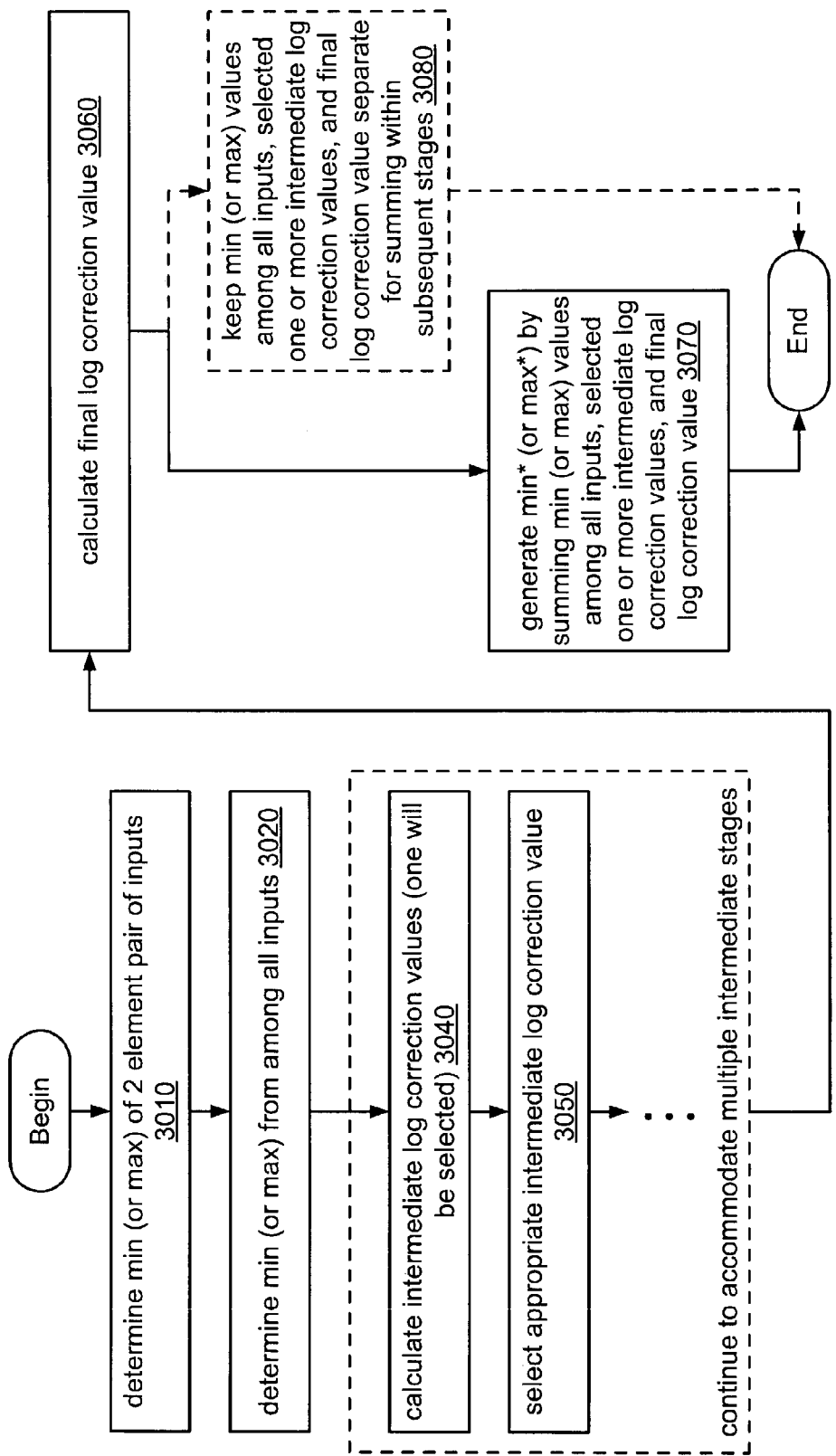
FIG. 30 is a flowchart illustrating an embodiment of a single stage min* (or max*) processing method using approximation that is performed according to the invention.

FIG. 30 is a flowchart illustrating an embodiment of a single stage min* (or max*) processing method using approximation that is performed according to the invention. The method begins by determining the min (or max) of 2 element pair of inputs, as shown in a block 3010. Then, as shown in a block 3020, the method continues with determining min (or max) from among all inputs.

The method then continues with calculating intermediate log correction values (one will be selected), as shown in a block 3040. Then, the method continues with actually selecting the appropriate intermediate log correction value, as shown in a block 3050. It is noted that the operations within these two blocks may be repeated, as necessary, to accommodate multiple intermediate stages.

Afterwards, as shown in a block 3060, the method actually calculates a final log correction value. The method then generates min* (or max*) by summing min (or max) values among all inputs, selected one or more intermediate log correction values, and final log correction value, as shown in a block 3070, in one embodiment. Alternatively, in other embodiments, the method keeps min (or max) values among all inputs, selected one or more intermediate log correction values, and final log correction value separate for summing within subsequent stages, as shown in a block 3080.

It is noted that the methods described within the preceding 3 figures may be performed within any of the appropriate designs described above without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. An apparatus, comprising:
a preliminary calculation circuitry that is operable to:
calculate a plurality of 2 element log correction values, each 2 element log correction value of the plurality of 2 element log correction values corresponds to 2 inputs of a plurality of inputs;
add each 2 element log correction value of the plurality of 2 element log correction values to a first of its corresponding 2 inputs from among the plurality of inputs thereby generating at least a first value;
add each 2 element log correction value of the plurality of 2 element log correction values to its a second of its corresponding 2 inputs from among the plurality of inputs thereby generating at least a second value; and
determine a mm result or max result using the first value and the second value;
a final log correction value calculation circuitry that is operable to calculate a final log correction value that corresponds to all inputs of the plurality of inputs; and
an adder that is operable to sum the mm result or the max result and the final log correction value to calculate a min* result or a max* result that is employed when calculating a state metric for use in decoding a coded signal.

2. The apparatus of claim 1, wherein:
the preliminary calculation circuitry includes a min selection control circuitry or a max selection control circuitry; and
the min selection control circuitry or the max selection control circuitry is operable to select a min value or a max value from among a 2 element pair of inputs of the plurality of inputs.

3. The apparatus of claim 1, wherein:
the preliminary calculation circuitry includes a min selection circuitry or a max selection circuitry; and
the min selection circuitry or the max selection circuitry is operable simultaneously to generate the first value and the second value.

4. The apparatus of claim 1, wherein:
the preliminary calculation circuitry includes a min selection control circuitry or a max selection control circuitry;
the min selection control circuitry or the max selection control circuitry is operable to select a min value or a max value from among a 2 element pair of inputs of the plurality of inputs;
the preliminary calculation circuitry includes a min selection circuitry or a max selection circuitry; and
the min selection circuitry or the max selection circuitry is operable simultaneously to generate the first value and the second value.

5. The apparatus of claim 1, wherein:
the preliminary calculation circuitry includes a min selection circuitry or a max selection circuitry; and
the min selection circuitry or the max selection circuitry is operable simultaneously to generate the first value and the second value.

6. The apparatus of claim 1, wherein:
the preliminary calculation circuitry is operable to calculate a plurality of sign bits that corresponds to differences between 2 element pairs of inputs of the plurality of inputs;
the preliminary calculation circuitry includes a min selection circuitry or a max selection circuitry; and
the min selection circuitry or the max selection circuitry is operable to simultaneously to generate the first value and the second value.

7. The apparatus of claim 1, wherein:
the min result or the max result and the final log correction value are all kept separate for use in subsequent processing stages.

8. The apparatus of claim 1, wherein:
the apparatus is a soft-in soft-out (SISO) decoder that is implemented within a communication receiver; and
the communication receiver is contained within at least one of a satellite communication system, a High Definition Television (HDTV) communication system, a cellular communication system, a microwave communication system, a point-to-point communication system, a uni-directional communication system, a bi-directional communication system, a one to many communication system, and a fiber-optic communication system.

9. An apparatus, comprising:
a preliminary calculation circuitry that is operable to:
  calculate a plurality of 2 element log correction values, each 2 element log correction value of the plurality of 2 element log correction values corresponds to 2 inputs of a plurality of inputs;
  add simultaneously each 2 element log correction value of the plurality of 2 element log correction values to each of its corresponding 2 inputs from among the plurality of inputs thereby generating at least a first value and a second value;
  determine a min result or max result using the first value and the second value; and
a final log correction value calculation circuitry that is operable to calculate a final log correction value that corresponds to all inputs of the plurality of inputs; and
an adder that is operable to sum the min result or the max result and the final log correction value to calculate a min* result or a max* result that is employed when calculating a state metric for use in decoding a coded signal.

10. The apparatus of claim 9, wherein:
the min selection control circuitry or the max selection control circuitry is operable to select a min value or a max value from among a 2 element pair of inputs of the plurality of inputs;
the preliminary calculation circuitry includes a min selection circuitry or a max selection circuitry; and
the min selection circuitry or the max selection circuitry is operable simultaneously to generate the first value and the second value.

11. The apparatus of claim 9, further comprising:
a min selection circuitry or the max selection circuitry that is operable simultaneously to generate the first value and the second value.

12. The apparatus of claim 9, wherein:
the preliminary calculation circuitry is operable to calculate a plurality of sign bits that corresponds to differences between 2 element pairs of inputs of the plurality of inputs;
the preliminary calculation circuitry includes a min selection circuitry or a max selection circuitry; and
the min selection circuitry or the max selection circuitry is operable simultaneously to generate the first value and the second value.

13. The apparatus of claim 9, wherein:
the min result or the max result and the final log correction value are all kept separate for use in subsequent processing stages.

14. The apparatus of claim 9, wherein:
the apparatus is a soft-in soft-out (SISO) decoder that is implemented within a communication receiver; and
the communication receiver is contained within at least one of a satellite communication system, a High Definition Television (HDTV) communication system, a cellular communication system, a microwave communication system, a point-to-point communication system, a uni-directional communication system, a bi-directional communication system, a one to many communication system, and a fiber-optic communication system.

15. A method, comprising:
calculating a plurality of 2 element log correction values, each 2 element log correction value of the plurality of 2 element log correction values corresponds to 2 inputs of a plurality of inputs;
adding each 2 element log correction value to each of its corresponding 2 inputs from among the plurality of inputs thereby generating at least a first value and a second value;
determining a min result or max result using the first value and the second value;
calculating a final log correction value that corresponds to all inputs of the plurality of inputs; and
summing the min result or max result and the final log correction value to calculate a min* result or a max* result that is employed when calculating a state metric for use in decoding a coded signal.

16. The method of claim 15, further comprising selecting a min value or a max value from among a 2 element pair of inputs of the plurality of inputs.

17. The method of claim 15, further comprising simultaneously calculating the first value and the second value.

18. The method of claim 15, further comprising:
calculating a plurality of sign bits that corresponds to differences between 2 element pairs of inputs of the plurality of inputs; and
simultaneously calculating the first value and the second value.

19. The method of claim 15, further comprising:
calculating a plurality of sign bits that corresponds to differences between 2 element pairs of inputs of the plurality of inputs, wherein the plurality of sign bits indicate relative relationships between each 2 element pair of inputs of the plurality of inputs; and
simultaneously calculating the first value and the second value.

20. The method of claim 15, further comprising:
calculating a plurality of sign bits that corresponds to differences between 2 element pairs of inputs of the plurality of inputs, wherein the plurality of sign bits indicate relative relationships between each 2 element pair of inputs of the plurality of inputs;
simultaneously calculating the first value and the second value; and
keeping the min result or max result and the final log correction value separate for use in subsequent processing stages.

21. The method of claim 15, further comprising keeping the min result or max result and the final log correction value separate for use in subsequent processing stages.

22. The method of claim 15, wherein:
the method is performed within a soft-in soft-out (SISO) decoder that is implemented within a communication receiver; and the communication receiver is contained within at least one of a satellite communication system, a High Definition Television (HDTV) communication system, a cellular communication system, a microwave communication system, a point-to-point communication system, a uni-directional communication system, a bi-directional communication system, a one to many communication system, and a fiber-optic communication system.

23. An apparatus, comprising:
a preliminary calculation circuitry that is operable to determine a min result or max result using a first value and a second value, wherein:
the first value is a sum of a first input of a plurality of inputs and a first 2 element log correction value that corresponds to the first input and a second input of the plurality of inputs; and
the second value is a sum of the second input and the 2 element first log correction value that corresponds to the first input and the second input;
a final log correction value calculation circuitry that is operable to calculate a final log correction value that corresponds to all inputs of the plurality of inputs; and
an adder that is operable to sum the min result or the max result and the final log correction value to calculate a min* result or a max* result that is employed when calculating a state metric for use in decoding a coded signal.

24. The apparatus of claim 23, wherein:
the preliminary calculation circuitry is operable to:
calculate a plurality of 2 element log correction values, each 2 element log correction value of the plurality of 2 element log correction values corresponds to 2 inputs of a plurality of inputs; and
add each 2 element log correction value to its corresponding input from among the plurality of inputs thereby generating at least the first value and the second value.

25. The apparatus of claim 24, wherein:
the preliminary calculation circuitry includes a min selection circuitry or a max selection circuitry; and
the min selection circuitry or the max selection circuitry is operable simultaneously to generate the first value and the second value.

26. The apparatus of claim 24, wherein:
the preliminary calculation circuitry includes a min selection control circuitry or a max selection control circuitry;
the preliminary calculation circuitry includes a min selection circuitry or a max selection circuitry; and
the min selection circuitry or the max selection circuitry is operable simultaneously to generate the first value and the second value.

27. The apparatus of claim 24, wherein:
the preliminary calculation circuitry includes a min selection circuitry or a max selection circuitry; and
the min selection circuitry or the max selection circuitry is operable simultaneously to generate the first value and the second value.

28. The apparatus of claim 24, wherein:
the preliminary calculation circuitry is operable to calculate a plurality of sign bits that corresponds to differences between 2 element pairs of inputs of the plurality of inputs;
the preliminary calculation circuitry includes a min selection circuitry or a max selection circuitry; and the min selection circuitry or the max selection circuitry is operable simultaneously to generate the first value and the second value.

29. The apparatus of claim 23, wherein:
the preliminary calculation circuitry includes a min selection control circuitry or a max selection control circuitry; and
the min selection control circuitry or the max selection control circuitry is operable to select a min value or a max value from among a 2 element pair of inputs of the plurality of inputs.

30. The apparatus of claim 23, wherein:
the min result or the max result and the final log correction value are all kept separate for use in subsequent processing stages.

31. The apparatus of claim 23, wherein:
the apparatus is a soft-in soft-out (SISO) decoder is implemented within a communication receiver; and
the communication receiver is contained within at least one of a satellite communication system, a High Definition Television (HDTV) communication system, a cellular communication system, a microwave communication system, a point-to-point communication system, a uni-directional communication system, a bi-directional communication system, a one to many communication system, and a fiber-optic communication system.

32. A method, comprising:
determining a min result or max result using a first value and a second value, wherein:
the first value is a sum of a first input of a plurality of inputs and a first 2 element log correction value that corresponds to the first input and a second input of the plurality of inputs; and
the second value is a sum of the second input and the 2 element first log correction value that corresponds to the first input and a second input;
calculating a final log correction value that corresponds to all inputs of the plurality of inputs; and
summing the min result or max result and the final log correction value to calculate a min* result or a max* result that is employed when calculating a state metric for use in decoding a coded signal.

33. The method of claim 32, further comprising:
calculating a plurality of 2 element log correction values, each 2 element log correction value of the plurality of 2 element log correction values corresponds to 2 inputs of a plurality of inputs; and
adding each 2 element log correction value to its corresponding input from among the plurality of inputs thereby generating at least the first value and the second value.

34. The method of claim 33, further comprising simultaneously calculating the first value and the second value.

35. The method of claim 33, further comprising:
calculating a plurality of sign bits that corresponds to differences between 2 element pairs of inputs of the plurality of inputs; and
simultaneously calculating the first value and the second value.

36. The method of claim 33, further comprising:
calculating a plurality of sign bits that corresponds to differences between 2 element pairs of inputs of the plurality of inputs, wherein the plurality of sign bits indicate relative relationships between each 2 element pair of inputs of the plurality of inputs; and simultaneously calculating the first value and the second value.

37. The method of claim 33, further comprising:
calculating a plurality of sign bits that corresponds to differences between 2 element pairs of inputs of the plurality of inputs, wherein the plurality of sign bits indicate relative relationships, between each 2 element pair of inputs of the plurality of inputs;
simultaneously calculating the first value and the second value; and
keeping the min result or max result and the final log correction value separate for use in subsequent processing stages.

38. The method of claim 32, further comprising selecting a min value or a max value from among a 2 element pair of inputs of the plurality of inputs.

39. The method of claim 32, further comprising keeping the min result or max result and the final log correction value separate for use in subsequent processing stages.

40. The method of claim 32, wherein:
the method is performed within a soft-in soft-out (SISO) decoder that is implemented within a communication receiver; and
the communication receiver is contained within at least one of a satellite communication system, a High Definition Television (HDTV) communication system, a cellular communication system, a microwave communication system, a point-to-point communication system, a uni-directional communication system, a bi-directional communication system, a one to many communication system, and a fiber-optic communication system.

41. An apparatus, comprising:
a preliminary calculation circuitry that is operable to:
calculate a plurality of 2 element log correction values, each 2 element log correction value of the plurality of 2 element log correction values corresponds to 2 inputs of a plurality of inputs;
add each 2 element log correction value to each of its corresponding input from among the plurality of inputs thereby generating at least a first value and a second value; and
determine a min result or max result using at least the first value and the second value; and
a final log correction value calculation circuitry that is operable to calculate a final log correction value that corresponds to all inputs of the plurality of inputs, wherein the final log correction value is employed when calculating a state metric for use in decoding a coded signal.

42. The apparatus of claim 41, further comprising:
an adder that is operable to sum the min result or the max result and the final log correction value to calculate a min* result or a max* result.

43. The apparatus of claim 41, wherein:
the first value is a sum of a first input of a plurality of inputs and a first 2 element log correction value that corresponds to the first input and a second input of the plurality of inputs; and
the second value is a sum of the second input and the 2 element first log correction value that corresponds to the first input and a second input.

44. The apparatus of claim 41, wherein:
the preliminary calculation circuitry includes a min selection control circuitry or a max selection control circuitry; and
the min selection control circuitry or the max selection control circuitry is operable to select a min value or a max value from among a 2 element pair of inputs of the plurality of inputs.

45. The apparatus of claim 41, wherein:
the preliminary calculation circuitry includes a min selection circuitry or a max selection circuitry; and
the min selection circuitry or the max selection circuitry is operable simultaneously to generate the first value and the second value.

46. The apparatus of claim 41, wherein:
the preliminary calculation circuitry includes a min selection control circuitry or a max selection control circuitry;
the preliminary calculation circuitry includes a min selection circuitry or a max selection circuitry; and
the min selection circuitry or the max selection circuitry is operable simultaneously to generate the first value and the second value.

47. The apparatus of claim 41, wherein:
the preliminary calculation circuitry includes a min selection circuitry or a max selection circuitry;
the min selection circuitry or the max selection circuitry is operable simultaneously to generate the first value and the second value; and
the min result or the max result and the final log correction value are all kept separate for use in subsequent processing stages.

48. The apparatus of claim 41, wherein:
the preliminary calculation circuitry is operable to calculate a plurality of sign bits that corresponds to differences between 2 element pairs of inputs of the plurality of inputs;
the preliminary calculation circuitry includes a min selection circuitry or a max selection circuitry; and
the min selection circuitry or the max selection circuitry is operable simultaneously to generate the first value and the second value.

49. The apparatus of claim 41, wherein:
the min result or the max result and the final log correction value are all kept separate for use in subsequent processing stages.

50. The apparatus of claim 41, wherein:
the apparatus is a soft-in soft-out (SISO) decoder is implemented within a communication receiver; and
the communication receiver is contained within at least one of a satellite communication system, a High Definition Television (HDTV) communication system, a cellular communication system, a microwave communication system, a point-to-point communication system, a uni-directional communication system, a bi-directional communication system, a one to many communication system, and a fiber-optic communication system.

* * * * *

UNITED STATES PATENT AND TRADEMARK OFFICE
CERTIFICATE OF CORRECTION

| | | |
|---|---|---|
| PATENT NO. | : 7,137,059 B2 | Page 1 of 1 |
| APPLICATION NO. | : 10/335702 | |
| DATED | : November 14, 2006 | |
| INVENTOR(S) | : Kelly Cameron et al. | |

It is certified that error appears in the above-identified patent and that said Letters Patent is hereby corrected as shown below:

Column 30, line 12, in Claim 1: replace "mm" with --min--

Column 30, line 17, in Claim 1: replace "mm" with --min--

Signed and Sealed this

First Day of July, 2008

JON W. DUDAS
*Director of the United States Patent and Trademark Office*